US012757708B2

(12) United States Patent
Choi et al.

(10) Patent No.: US 12,757,708 B2
(45) Date of Patent: Oct. 6, 2026

(54) INTEGRATED CIRCUIT (IC) DEVICE WITH HYBRID METAL LAYER

(71) Applicant: Intel Corporation, Santa Clara, CA (US)

(72) Inventors: June Choi, Portland, OR (US); Charles Henry Wallace, Portland, OR (US); Richard E. Schenker, Portland, OR (US); Nikhil Jasvant Mehta, Portland, OR (US)

(73) Assignee: Intel Corporation, Santa Clara, CA (US)

(*) Notice: Subject to any disclaimer, the term of this patent is extended or adjusted under 35 U.S.C. 154(b) by 65 days.

(21) Appl. No.: 17/933,000

(22) Filed: Sep. 16, 2022

(65) Prior Publication Data

US 2024/0096785 A1 Mar. 21, 2024

(51) Int. Cl.

| | |
|---|---|
| ***H10W 20/42*** | (2026.01) |
| ***H10W 20/00*** | (2026.01) |
| ***H10W 20/41*** | (2026.01) |
| ***H10W 20/44*** | (2026.01) |

(52) U.S. Cl.

CPC ......... *H10W 20/42* (2026.01); *H10W 20/056* (2026.01); *H10W 20/089* (2026.01); *H10W 20/435* (2026.01); *H10W 20/4403* (2026.01); *H10W 20/4421* (2026.01); *H10W 20/4432* (2026.01)

(58) Field of Classification Search

CPC . H10W 20/42; H10W 20/056; H10W 20/089; H10W 20/435; H10W 20/4403; H10W 20/4421; H10W 20/4432

See application file for complete search history.

(56) References Cited

U.S. PATENT DOCUMENTS

| | | | | |
|---|---|---|---|---|
| 9,530,737 | B1* | 12/2016 | Fu | H01L 23/53238 |
| 2012/0104471 | A1* | 5/2012 | Chang | H01L 21/76838 257/E21.409 |
| 2014/0239503 | A1* | 8/2014 | Huisinga | H01L 21/76814 438/653 |
| 2020/0035605 | A1* | 1/2020 | Tsai | H01L 23/485 |
| 2021/0134664 | A1* | 5/2021 | Motoyama | H01L 23/53238 |
| 2021/0357565 | A1* | 11/2021 | Fang | G06F 30/392 |
| 2022/0384311 | A1* | 12/2022 | Oh | H01L 21/76898 |

* cited by examiner

*Primary Examiner* — Syed I Gheyas
(74) *Attorney, Agent, or Firm* — Akona IP PC

(57) ABSTRACT

An IC device includes a transistor, a first layer, and a second layer. The first layer is coupled to the transistors and is between the transistor and the second layer in a first direction. The first layer includes a first structure and a second structure. The first structure includes a first metal (e.g., Ru). The second structure includes a second metal (e.g., Cu). The second structure may be wrapped around by a different material that may include a third metal (e.g., Co). The first structure may be shorter than the second structure in the first direction and narrower than the second structure in a second direction orthogonal to the first direction. The first structure may be closer to the second layer than the second structure in the first direction. The first structure may be a wordline of a memory. The second structure may be a bitline.

20 Claims, 16 Drawing Sheets

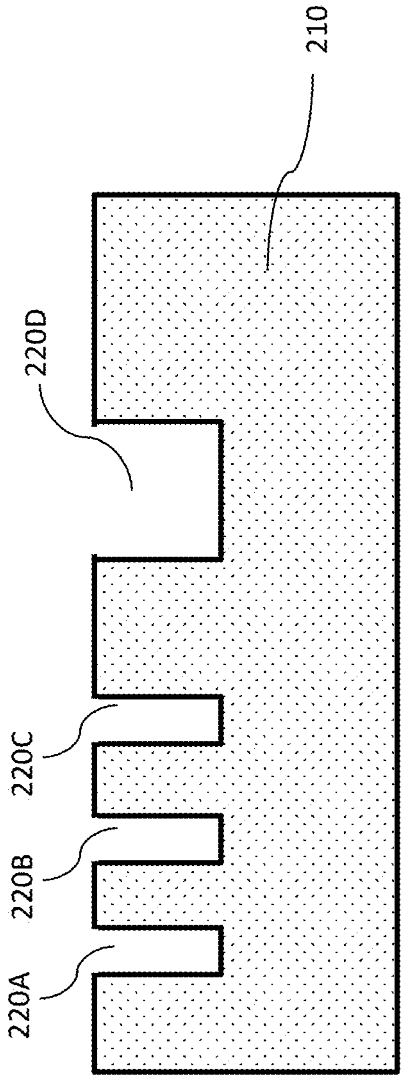
FIG. 2A
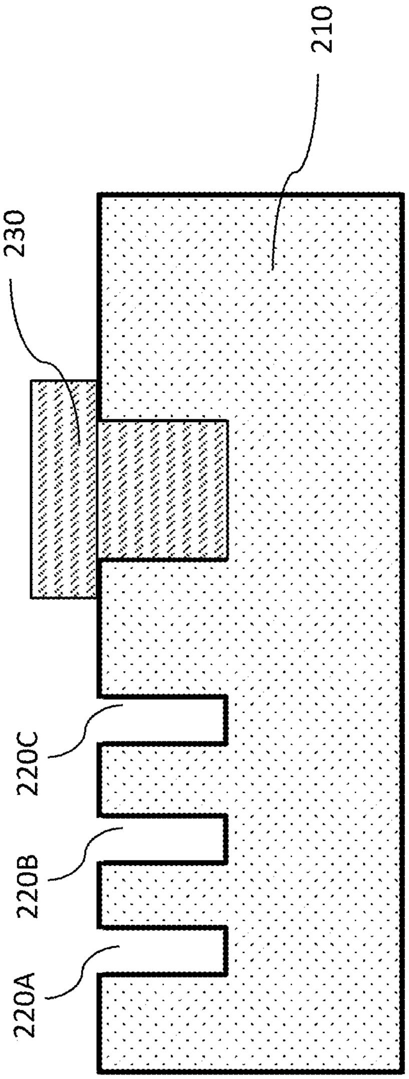
FIG. 2B
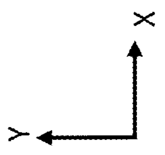

200

INTEGRATED CIRCUIT (IC) DEVICE WITH HYBRID METAL LAYER

BACKGROUND

IC fabrication usually includes two stages. The first stage is referred to as the front end of line (FEOL). The second stage is referred to as the back end of line (BEOL). In the FEOL, individual components (e.g., transistor, capacitors, resistors, etc.) can be patterned in a wafer. In the BEOL, metal layers, vias, and insulating layers can be formed to get the individual components interconnected. The BEOL usually starts with forming the first metal layer on the wafer. The first metal layer is often called M0. More metal layers can be formed on top of M0, and these metal layers are often called M1, M2, and so on.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example, and not by way of limitation, in the figures of the accompanying drawings.

FIGS. 2A-2F illustrate an example process of forming a metal layer, according to some embodiments of the disclosure.

DETAILED DESCRIPTION

Figure 1:
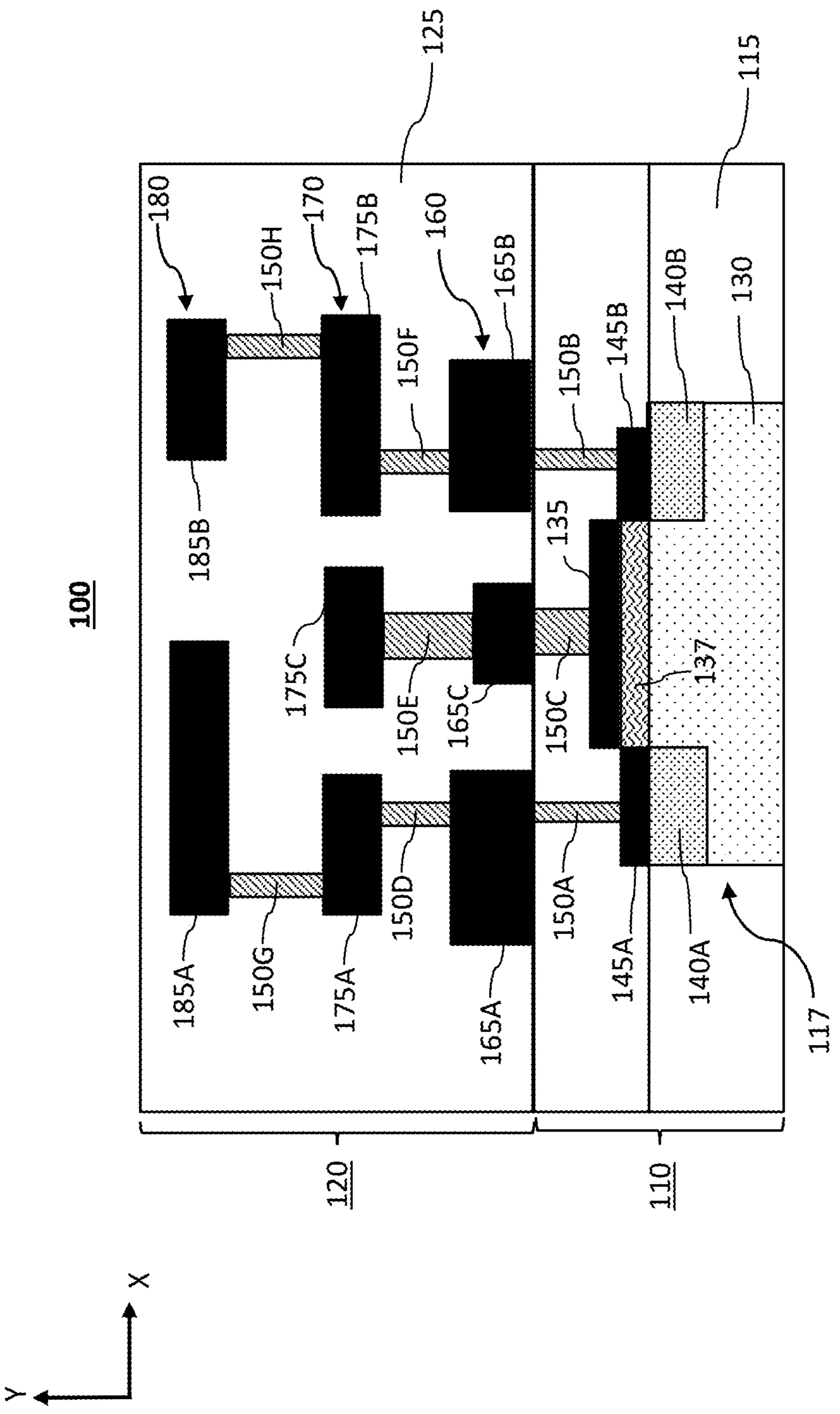
FIG. 1 illustrates an IC device comprising an FEOL section and a BEOL section, according to some embodiments of the disclosure.

The systems, methods, and devices of this disclosure each have several innovative aspects, no single one of which is solely responsible for all the desirable attributes disclosed herein. Details of one or more implementations of the subject matter described in this specification are set forth in the description below and the accompanying drawings.

Fabrication of metal layers in BEOL faces challenges. For instance, low capacitance is preferred for wordlines of memory circuits (e.g., a dynamic random-access memory (DRAM) or static random-access memory (SRAM)) with tight-pitch, e.g., in resistance-capacitance trade-off situation. To reduce capacitance, the height of a metal layer needs to be reduced. However, low resistance is required for bitlines of such memory circuits. To reduce capacitance, the metal layer height needs to be increased. Thus, one metal height cannot meet the requirements for both wordlines and bitlines of a given memory circuit. Also, metal resistance can change as critical dimensions (e.g., widths) of metal layers change. The change in resistance as a function of critical dimension can be different for different metals. As the metal critical dimension becomes tighter, the optimal metal resistance cannot be met by one common metal material choice.

Currently available BEOL technologies usually use two different metals to form a metal layer in two processes. In the first process, some regions of the metal layer can be formed with one of the metals, while the other regions of the metal layer are being masked and reserved for the other metal. In the second process, the masked regions can be exposed and filled with the other metal. However, the heights of the regions formed in the first process and the second process are the same. Also, these currently available BEOL technologies usually require polish, but polish can be difficult as the two metals can have different polish selectivity. Therefore, the currently available BEOL technologies fail to fabricate metal layers that meet the different requirements for bitlines and wordlines. Improved BEOL technology is needed.

Embodiments of the present disclosure may improve on at least some of the challenges and issues described above by providing hybrid metal layers. An example hybrid metal layer includes multiple structures. The structures include different metals and have different dimensions. For instance, a first structure in the hybrid metal layer includes a first metal, and a second structure in the hybrid metal layer includes a second metal. The two metals may be selected based on widths of the two structures. A width of the first structure may be smaller than a width of the second structure. For the width of the first structure, the first metal may have lower resistance than the second metal. For the width of the second structure, the second metal may have lower resistance than the first metal. In an embodiment, the first metal is ruthenium (Ru), and the second metal is copper (Cu). The second metal may be enclosed by an electrically conductive material that constitutes a barrier to prevent contamination of the second metal by humid, air, or other contaminants. The electrically conductive material may include cobalt (Co).

Also, the height of the second structure may be greater than the height of the first structure. The capacitance of the second structure may be lower than the first structure. To fabricate the second structure having the greater height, a double-deck patterning in a trench for the second structure may be used. The double-deck patterning may include two stages. In the first stage, trenches may be formed in an electrical insulator at regions where both the first structure and the second structure are to be formed. The first structure can be formed in the first stage by filling the trench corresponding to the first structure with the first metal. The trench corresponding to the second structure may also be filled with the first metal. In the second stage, additional electrical insulator can be deposited on top of the original electrical insulator. A deeper trench can be formed by etching a portion of the additional electrical insulator and the first metal in the trench corresponding to the second structure. The second structure can be formed by adding the second metal into the deeper trench. In some embodiments, the deeper trench may be coated with a liner before the second metal is added into the deeper trench. As the second structure is formed with a deeper trench, the second structure can have a greater height.

With the different metal choices and different heights, the hybrid metal layer in the present disclosure can provide low resistance through the first structure and can provide low capacitance with optimized resistance through the second structure. In some embodiments, the first structure may be used as a wordline in a memory device, and the second structure may be used as a bitline in the memory device. The hybrid metal layer may include multiple first structures or multiple second structures.

It should be noted that, in some settings, the term "nanoribbon" has been used to describe an elongated semiconductor structure that has a substantially rectangular transverse cross-section (e.g., a cross-section in a plane perpendicular to the longitudinal axis of the structure), while the term "nanowire" has been used to describe a similar structure but with a substantially circular or square transverse cross-sections. In the following, a single term "nanoribbon" is used to describe an elongated semiconductor structure independent of the shape of the transverse cross-section. Thus, as used herein, the term "nanoribbon" is used to cover elongated semiconductor structures that have substantially rectangular transverse cross-sections (possibly with rounded corners), elongated semiconductor structures that have substantially square transverse cross-sections (possibly with rounded corners), elongated semiconductor structures that have substantially circular or elliptical/oval transverse cross-sections, as well as elongated semiconductor structures that have any polygonal transverse cross-sections.

In the following, some descriptions may refer to a particular source or drain (S/D) region or contact being either a source region/contact or a drain region/contact. However, unless specified otherwise, which region/contact of a transistor or diode is considered to be a source region/contact and which region/contact is considered to be a drain region/contact is not important because, as is common in the field of FETs, designations of source and drain are often interchangeable. Therefore, descriptions of some illustrative embodiments of the source and drain regions/contacts provided herein are applicable to embodiments where the designation of source and drain regions/contacts may be reversed.

As used herein, the term "metal layer" may refer to a layer above a substrate that includes electrically conductive interconnect structures for providing electrical connectivity between different IC components. Metal layers described herein may also be referred to as "interconnect layers" to clearly indicate that these layers include electrically conductive interconnect structures which may, but do not have to be, metal.

The systems, methods and devices of this disclosure each have several innovative aspects, no single one of which is solely responsible for all of the desirable attributes disclosed herein. Details of one or more implementations of the subject matter described in this specification are set forth in the description below and the accompanying drawings.

In the following detailed description, various aspects of the illustrative implementations may be described using terms commonly employed by those skilled in the art to convey the substance of their work to others skilled in the art. For example, the term "connected" means a direct electrical or magnetic connection between the things that are connected, without any intermediary devices, while the term "coupled" means either a direct electrical or magnetic connection between the things that are connected, or an indirect connection through one or more passive or active intermediary devices. The term "circuit" means one or more passive and/or active components that are arranged to cooperate with one another to provide a desired function. If used, the terms "oxide," "carbide," "nitride," etc. refer to compounds containing, respectively, oxygen, carbon, nitrogen, etc., the term "high-k dielectric" refers to a material having a higher dielectric constant (k) than silicon oxide, while the term "low-k dielectric" refers to a material having a lower k than silicon oxide. The terms "substantially," "close," "approximately," "near," and "about," generally refer to being within +/−10%, e.g., within +/−5% or within +/−2%, of a target value based on the context of a particular value as described herein or as known in the art. Similarly, terms indicating orientation of various elements, e.g., "coplanar," "perpendicular," "orthogonal," "parallel," or any other angle between the elements, generally refer to being within +/−8% of a target value, e.g., within +/−5% of a target value or within +/−2% of a target value, based on the context of a particular value as described herein or as known in the art. Also, the term "or" refers to an inclusive "or" and not to an exclusive "or."

The terms "over," "under," "between," and "on" as used herein refer to a relative position of one material layer or component with respect to other layers or components. For example, one layer disposed over or under another layer may be directly in contact with the other layer or may have one or more intervening layers. Moreover, one layer disposed between two layers may be directly in contact with the two layers or may have one or more intervening layers. In contrast, a first layer "on" a second layer is in direct contact with that second layer. Similarly, unless explicitly stated otherwise, one feature disposed between two features may be in direct contact with the adjacent features or may have one or more intervening layers.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B, and C). The term "between," when used with reference to measurement ranges, is inclusive of the ends of the measurement ranges. As used herein, the notation "A/B/C" means (A), (B), and/or (C).

The description may use the phrases "in an embodiment" or "in embodiments," which may each refer to one or more of the same or different embodiments. Furthermore, the terms "comprising," "including," "having," and the like, as used with respect to embodiments of the present disclosure, are synonymous. The disclosure may use perspective-based descriptions such as "above," "below," "top," "bottom," and "side"; such descriptions are used to facilitate the discussion and are not intended to restrict the application of disclosed embodiments. The accompanying drawings are not necessarily drawn to scale. Unless otherwise specified, the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

In the following detailed description, reference is made to the accompanying drawings that form a part hereof, and in which is shown, by way of illustration, embodiments that may be practiced. It is to be understood that other embodiments may be utilized and structural or logical changes may be made without departing from the scope of the present disclosure. Therefore, the following detailed description is not to be taken in a limiting sense. For convenience, if a collection of drawings designated with different letters are present, e.g., FIGS. 7A-7B, such a collection may be referred to herein without the letters, e.g., as "FIG. 7."

In the drawings, some schematic illustrations of example structures of various devices and assemblies described herein may be shown with precise right angles and straight lines, but it is to be understood that such schematic illustrations may not reflect real-life process limitations which may cause the features to not look so "ideal" when any of the structures described herein are examined using e.g., scanning electron microscopy (SEM) images or transmission electron microscope (TEM) images. In such images of real structures, possible processing defects could also be visible, e.g., not-perfectly straight edges of materials, tapered vias or other openings, inadvertent rounding of corners or variations in thicknesses of different material layers, occasional screw, edge, or combination dislocations within the crystalline region, and/or occasional dislocation defects of single atoms or clusters of atoms. There may be other defects not listed here but that are common within the field of device fabrication. Inspection of layout and mask data and reverse engineering of parts of a device to reconstruct the circuit using e.g., optical microscopy, TEM, or SEM, and/or inspection of a cross-section of a device to detect the shape and the location of various device elements described herein using, e.g., Physical Failure Analysis (PFA) would allow determination of presence of varactor devices with backside electrical contacts as described herein.

Various operations may be described as multiple discrete actions or operations in turn in a manner that is most helpful in understanding the claimed subject matter. However, the order of description should not be construed as to imply that these operations are necessarily order dependent. In particular, these operations may not be performed in the order of presentation. Operations described may be performed in a different order from the described embodiment. Various additional operations may be performed, and/or described operations may be omitted in additional embodiments.

Various varactor devices with backside electrical contacts as described herein may be implemented in, or associated with, one or more components associated with an IC or/and may be implemented between various such components. In various embodiments, components associated with an IC include, for example, transistors, diodes, power sources, resistors, capacitors, inductors, sensors, transceivers, receivers, antennas, etc. Components associated with an IC may include those that are mounted on IC or those connected to an IC. The IC may be either analog or digital and may be used in a number of applications, such as microprocessors, optoelectronics, logic blocks, audio amplifiers, etc., depending on the components associated with the IC. The IC may be employed as part of a chipset for executing one or more related functions in a computer.

FIG. 1 illustrates an IC device 100 comprising an FEOL (back end of line) 110 and a BEOL (back end of line) 120, according to some embodiments of the disclosure. The FEOL section 110 includes a support 115 and a transistor 117. The BEOL section 120 includes metal layers 160, 170, and 180. In other embodiments, the IC device 100 may include fewer, more, or different components. For instance, the FEOL section 110 may include more transistors, or other semiconductor devices not shown in FIG. 1. Also, the BEOL section 120 may include fewer or more metal layers.

The support 115 may be any suitable structure, such as a substrate, a die, a wafer, or a chip, based on which the transistor 117 can be built. The support 115 may, e.g., be the wafer 2000 of FIG. 6A, discussed below, and may be, or be included in, a die, e.g., the singulated die 2002 of FIG. 6B, discussed below. In some embodiments, the support 115 may be a semiconductor substrate composed of semiconductor material systems including, for example, N-type or P-type materials systems, and, in some embodiments, the channel region 130, described herein, may be a part of the support 115. In some embodiments, the semiconductor substrate may be a crystalline substrate formed using a bulk silicon or a silicon-on-insulator substructure. In other embodiments, the semiconductor substrate may be formed using alternate materials, which may or may not be combined with silicon, that include but are not limited to germanium, indium antimonide, lead telluride, indium arsenide, indium phosphide, gallium arsenide, indium gallium arsenide, gallium antimonide, or other combinations of group III-V, group II-VI, or group IV materials. In some embodiments, the substrate may be non-crystalline. In some embodiments, the support structure may be a printed circuit board (PCB) substrate. One or more transistors, such as the transistor 117 may be built on the support 115.

Although a few examples of materials from which the support 115 may be formed are described here, any material that may serve as a foundation upon which an IC may be built falls within the spirit and scope of the present disclosure. In various embodiments, the support 115 may include any such substrate, possibly with some layers and/or devices already formed thereon, not specifically shown in the present figures. As used herein, the term "support" does not necessarily mean that it provides mechanical support for the IC devices/structures (e.g., transistors, capacitors, interconnects, and so on) built thereon. For example, some other structure (e.g., a carrier substrate or a package substrate) may provide such mechanical support and the support 115 may provide material "support" in that, e.g., the IC devices/structures described herein are build based on the semiconductor materials of the support 115. However, in some embodiments, the support 115 may provide mechanical support.

The transistor 117 may be a field-effect transistor (FET), such as metal-oxide-semiconductor FET (MOSFET), tunnel FET (TFET), fin-based transistor (e.g., FinFET), nanoribbon-based transistor, nanowire-based transistor, gate-all-around (GAA) transistor, other types of FET, or a combination of both. A transistor 117 includes a semiconductor structure that includes a channel region 130, a source region 140A, and a drain region 140B. The semiconductor structure of the transistor 117 may be at least partially in the substrate 115. The substrate 115 may include a semiconductor material, from which at least a portion of the semiconductor structure is formed. The semiconductor structure of the transistor 117 (or a portion of the semiconductor structure, e.g., the channel region 130) may be a planar structure or a non-planar structure. A non-planar structure is a three-dimensional structure, such as fin, nanowire, or nanoribbon. A non-planar structure may have a longitudinal axis and a transvers cross-section perpendicular to the longitudinal axis. In some embodiments, a dimension of the non-planar structure along the longitudinal axis may be greater than dimensions along other directions, e.g., directions along axes perpendicular to the longitudinal axis.

The channel region 130 includes a channel material. The channel material may be composed of semiconductor material systems including, for example, n-type or p-type materials systems. In some embodiments, the channel material may include a high mobility oxide semiconductor material, such as tin oxide, antimony oxide, indium oxide, indium tin oxide, titanium oxide, zinc oxide, indium zinc oxide, gallium oxide, titanium oxynitride, ruthenium oxide, or tungsten oxide. In some embodiments, the channel material may include a compound semiconductor with a first sub-lattice of at least one element from Group III of the periodic table (e.g., Al, Ga, In), and a second sub-lattice of at least one element of group V of the periodic table (e.g., P, As, Sb). In some embodiments, the channel material may include a compound semiconductor with a first sub-lattice of at least one element from Group II of the periodic table (e.g., Zn, Cd, Hg), and a second sub-lattice of at least one element of Group IV of the periodic table (e.g., C, Si, Ge, Sn, Pb). In some embodiments, the channel material is an epitaxial semiconductor material deposited using an epitaxial deposition process. The epitaxial semiconductor material may have a polycrystalline structure with a grain size between about 2 nanometers and 100 nanometers, including all values and ranges therein.

For some example n-type transistor embodiments (i.e., for the embodiments where the transistor 117 is an NMOS (N-type metal-oxide-semiconductor) transistor or an n-type TFET), the channel material may advantageously include a III-V material having a high electron mobility, such as, but not limited to InGaAs, InP, InSb, and InAs. For some such embodiments, the channel material may be a ternary III-V alloy, such as InGaAs, GaAsSb, InAsP, or InPSb. For some InxGa1-xAs fin embodiments, In content (x) may be between 0.6 and 0.9, and may advantageously be at least 0.7 (e.g., In0.7Ga0.3As). In some embodiments with highest mobility, the channel material may be an intrinsic III-V material, i.e., a III-V semiconductor material not intentionally doped with any electrically active impurity. In alternate embodiments, a nominal impurity dopant level may be present within the channel material, for example to further fine-tune a threshold voltage Vt, or to provide HALO pocket implants, etc. Even for impurity-doped embodiments however, impurity dopant level within the channel material 304 may be relatively low, for example below 1015 dopant atoms per cubic centimeter (cm-3), and advantageously below $10^{13}$ $cm^{-3}$. These materials may be amorphous or polycrystalline, e.g., having a crystal grain size between 0.5 nanometers and 100 nanometers.

For some example p-type transistor embodiments (i.e., for the embodiments where the transistor 117 is a PMOS (P-type metal-oxide-semiconductor) transistor or a p-type TFET), the channel material may advantageously be a Group IV material having a high hole mobility, such as, but not limited to Ge or a Ge-rich SiGe alloy. For some example embodiments, the channel material may have a Ge content between 0.6 and 0.9, and advantageously may be at least 0.7. In some embodiments with highest mobility, the channel material may be intrinsic III-V (or IV for P-type devices) material and not intentionally doped with any electrically active impurity. In alternate embodiments, one or more a nominal impurity dopant level may be present within the channel material, for example to further set a threshold voltage (Vt), or to provide HALO pocket implants, etc. Even for impurity-doped embodiments however, impurity dopant level within the channel portion is relatively low, for example below $10^{15}$ $cm^{-3}$, and advantageously below $10^{13}$ $cm^{-3}$. These materials may be amorphous or polycrystalline, e.g., having a crystal grain size between 0.5 nanometers and 100 nanometers.

In some embodiments, the channel material may include a high mobility oxide semiconductor material, such as tin oxide, antimony oxide, indium oxide, indium tin oxide, titanium oxide, zinc oxide, indium zinc oxide, indium gallium zinc oxide (IGZO), gallium oxide, titanium oxynitride, ruthenium oxide, aluminum zinc oxide, or tungsten oxide. In general, for a thin-film transistor (TFT), the channel material may include one or more of tin oxide, cobalt oxide, copper oxide, antimony oxide, ruthenium oxide, tungsten oxide, zinc oxide, gallium oxide, titanium oxide, indium oxide, titanium oxynitride, indium tin oxide, indium zinc oxide, nickel oxide, niobium oxide, copper peroxide, IGZO, indium telluride, molybdenite, molybdenum diselenide, tungsten diselenide, tungsten disulfide, molybdenum disulfide, N- or P-type amorphous or polycrystalline silicon, monocrystalline silicon, germanium, indium arsenide, indium gallium arsenide, indium selenide, indium antimonide, zinc antimonide, antimony selenide, silicon germanium, gallium nitride, aluminum gallium nitride, indium phosphite, black phosphorus, zinc sulfide, indium sulfide, gallium sulfide, each of which may possibly be doped with one or more of gallium, indium, aluminum, fluorine, boron, phosphorus, arsenic, nitrogen, tantalum, tungsten, and magnesium, etc. In some embodiments, a thin-film channel material may be deposited at relatively low temperatures, which allows depositing the channel material within the thermal budgets imposed on back-end fabrication to avoid damaging other components, e.g., front end components such as logic devices.

As noted above, the channel material may include IGZO. IGZO-based devices have several desirable electrical and manufacturing properties. IGZO has high electron mobility compared to other semiconductors, e.g., in the range of 20-50 times than amorphous silicon. Furthermore, amorphous IGZO (a-IGZO) transistors are typically characterized by high band gaps, low-temperature process compatibility, and low fabrication cost relative to other semiconductors.

IGZO can be deposited as a uniform amorphous phase while retaining higher carrier mobility than oxide semiconductors such as zinc oxide. Different formulations of IGZO include different ratios of indium oxide, gallium oxide, and zinc oxide. One particular form of IGZO has the chemical formula $InGaO_3(ZnO)_5$. Another example form of IGZO has an indium:gallium:zinc ratio of 1:2:1. In various other examples, IGZO may have a gallium to indium ratio of 1:1, a gallium to indium ratio greater than 1 (e.g., 2:1, 3:1, 4:1, 5:1, 6:1, 7:1, 8:1, 9:1, or 10:1), and/or a gallium to indium ratio less than 1 (e.g., 1:2, 1:3, 1:4, 1:5, 1:6, 1:7, 1:8, 1:9, or 1:10). IGZO can also contain tertiary dopants such as aluminum or nitrogen.

The source region 140A and the drain region 140B are connected to the channel region 130. The source region 140A and the drain region 140B each includes a semiconductor material with dopants. In some embodiments, the source region 140A and the drain region 140B have the same semiconductor material, which may be the same as the channel material of the channel region 130. A semiconductor material of the source region 140A or the drain region 140B may be a Group IV material, a compound of Group IV materials, a Group III/V material, a compound of Group III/V materials, a Group II/VI material, a compound of Group II/VI materials, or other semiconductor materials. Example Group II materials include zinc (Zn), cadmium (Cd), and so on. Example Group III materials include aluminum (Al), boron (B), indium (In), gallium (Ga), and so on. Example Group IV materials include silicon (Si), germanium (Ge), carbon (C), etc. Example Group V materials include nitrogen (N), phosphorus (P), arsenic (As), antimony (Sb), and so on. Example Group VI materials include sulfur(S), selenium (Se), tellurium (Te), oxygen (O), and so on. A compound of Group IV materials can be a binary compound, such as SiC, SiGe, and so on. A compound of Group III/V materials can be a binary, tertiary, or quaternary compound, such as GaN, InN, and so on. A compound of Group II/VI materials can be a binary, tertiary, or quaternary compounds, such as CdSe, CdS, CdTe, ZnO, ZnSe, ZnS, ZnTe, CdZnTe, CZT, HgCdTe, HgZnTe, and so on.

In some embodiments, the dopants in the source region 140A and the drain region 140B are the same type. In other embodiments, the dopants of the source region 140A and the drain region 140B may be different (e.g., opposite) types. In an example, the source region 140A has n-type dopants and the drain region 140B has p-type dopants. In another example, the source region 140A has p-type dopants and the drain region 140B has n-type dopants. Example n-type dopants include Te, S, As, tin (Sn), Si, Ga, Se, S, In, Al, Cd, chlorine (Cl), iodine (I), fluorine (F), and so on. Example p-type dopants include beryllium (Be), Zn, magnesium (Mg), Sn, P, Te, lithium (Li), sodium (Na), Ga, Cd, and so on.

In some embodiments, the source region 140A and the drain region 140B may be highly doped, e.g., with dopant concentrations of about $1 \cdot 10^{21}$ $cm^{-3}$, in order to advantageously form Ohmic contacts with the respective S/D contacts (also sometimes interchangeably referred to as "S/D electrodes"), although these regions may also have lower dopant concentrations and may form Schottky contacts in some implementations. Irrespective of the exact doping levels, the source region 140A and the drain region 140B may be the regions having dopant concentration higher than in other regions, e.g., higher than a dopant concentration in the channel region 130, and; therefore, may be referred to as "highly doped" (HD) regions.

The channel region 130 may include one or more semiconductor materials with doping concentrations significantly smaller than those of the source region 140A and the drain region 140B. For example, in some embodiments, the channel material of the channel region 130 may be an intrinsic (e.g., undoped) semiconductor material or alloy, not intentionally doped with any electrically active impurity. In alternate embodiments, nominal impurity dopant levels may be present within the channel material, for example to set a threshold voltage Vt, or to provide HALO pocket implants, etc. In such impurity-doped embodiments however, impurity dopant level within the channel material is still significantly lower than the dopant level in the source region 140A and the drain region 140B, for example below $10^{15}$ $cm^{-3}$ or below $10^{13}$ $cm^{-3}$. Depending on the context, the term "S/D terminal" may refer to a S/D region or a S/D contact or electrode of a transistor.

The transistor 117 also includes a source contact 145A over the source region 140A and a drain contact 145B over the drain region 140B. The source contact 145A and the drain contact 145B are electrically conductive and may be coupled to source and drain terminals for receiving electrical signals. The source contact 145A or the drain contact 145B includes one or more electrically conductive materials, such as metals. Examples of metals in the source contact 145A and the drain contact 145B may include, but are not limited to, Ru, Cu, Co, palladium (Pd), platinum (Pt), nickel (Ni), and so on.

The transistor 117 also includes a gate that is over or wraps around at least a portion of the channel region 130. The gate includes a gate electrode 135 and a gate insulator 137. The gate electrode 135 can be coupled to a gate terminal that controls gate voltages applied on the transistor 117. The gate electrode 135 may include one or more gate electrode materials, where the choice of the gate electrode materials may depend on whether the transistor 117 is a p-type transistor or an n-type transistor. For a p-type transistor, gate electrode materials that may be used in different portions of the gate electrode may include, but are not limited to, Ru, Pd, Pt, Co, Ni, and conductive metal oxides (e.g., ruthenium oxide). For an n-type transistor, gate electrode materials that may be used in different portions of the gate electrode, but are not limited to, hafnium, zirconium, titanium, tantalum, aluminum, alloys of these metals, and carbides of these metals (e.g., hafnium carbide, zirconium carbide, titanium carbide, tantalum carbide, and aluminum carbide). In some embodiments, the gate electrode 135 may include a stack of a plurality of gate electrode materials, where zero or more materials of the stack are workfunction (WF) materials and at least one material of the stack is a fill metal layer. Further materials/layers may be included next to the gate electrode for other purposes, such as to act as a diffusion barrier layer or/and an adhesion layer.

The gate insulator 137 separates at least a portion of the channel region 130 from the gate electrode 135 so that the channel region 130 is insulated from the gate electrode 135. In some embodiments, the gate insulator 137 may wrap around at least a portion of the channel region 130. The gate insulator 137 may also wrap around at least a portion of the source region 140A or the drain region 140B. At least a portion of the gate insulator 137 may be wrapped around by the gate electrode. The gate insulator 137 includes an electrical insulator, such as a dielectric material, hysteretic material, and so on. Example dielectric material includes oxide (e.g., Si based oxides, metal oxides, etc), high-k dielectric, and so on. Example hysteretic material include ferroelectric materials, antiferroelectric materials, etc.

In the embodiments of FIG. 1, the transistor 117 is coupled to the metal layer 160. The metal layer 160 is further couples to the metal layers 170 and 180. The metal layer 160, 170, or 180 may facilitate supply of electrical signals to the transistor 117. Even though not shown in FIG. 1, the metal layer 160, 170, or 180 may be coupled with other devices than the transistor 117, such as diodes, power sources, resistors, capacitors, inductors, sensors, transceivers, receivers, antennas. The transistor 117 and the metal layers 160, 170, and 180 are coupled through vias 150A-150H (collectively referred to as "vias 150" or "via 150"). A via 150 may be electrically conductive. A via 150 may include a metal, such as tungsten (W), Cu, or other metals. Different vias 150 may include different materials. The vias 150 can provide a conductive channel between the transistor 117 and the metal layer 160 or between two of the metal layers 160, 170, and 180.

The metal layers 160, 170, and 180 are stacked over the transistor 117 along the Y axis. The metal layer 160 may be the metal layer that is arranged closest to the FEOL section 110. In some embodiments, the metal layer 160 may be referred to as M0. The metal layer 170 may be referred to as M1. The metal layer 180 may be referred to as M2. There may be one or more metal layers that are arranged on top of the metal layer 180, which may be referred to as M3, M4, and so on. Certain portions of the metal layers 160, 170, and 180 may be insulated from each other by a BEOL insulator 125. The BEOL insulator 125 may include an electrical insulator, such as a dielectric material, hysteretic material, and so on. Example dielectric material includes oxide (e.g., Si based oxides, metal oxides, etc), high-k dielectric, and so on. Example hysteretic material include ferroelectric materials, antiferroelectric materials, etc.

The metal layer 160 includes structures 165A-165C. For purpose of illustration, FIG. 1 shows three structures in the metal layer 160. In other embodiments, the metal layer 160 may include fewer or more structures. The structures 165A-165C may also be referred to as metal lines. The structures 165A-165C are electrically conductive. The structures 165A-165C may also have different dimensions. For instance, a height of the structure 165A or 165B along the Y axis may be greater than a height of the structure 165C along the Y axis. A width of the 165A or 165B along the X axis may be greater than a width of the structure 165C along the X axis. In an example, the width of the 165A or 165B may be between about 20 and 50 nm. The width of the structure 165C may be not greater than about 12 nm.

In some embodiments, the structures 165A-165C include different metals, which may be selected based on dimensions of the structures 165A-165C. In an example, the structure 165A or 165B may include Cu, which may have a favorable resistance for critical dimensions in the range from 20-50 nm. The structure 165A or 165B may also include a liner and a cap, which are not shown in FIG. 1. The liner and cap form a barrier for the metal in the structure 165A or 165B and can protect the metal from being exposed to humid, air, chemicals, or other materials that can deteriorate the metal. The structure 165C may include Ru, which may have a favorable resistance for critical dimensions under 12 nm. The structures 165A-165C are shown as rectangles in FIG. 1. The structures 165A-165C may have different shapes.

The structures 165A-165C are insulated from each other by the BEOL insulator 125. The structures 165A-165C may be at different electrical potentials during operation of the IC device 100. The structure 165A is coupled to the source contact 145A through the via 150A. The structure 165B is coupled to the drain contact 145B through the via 150B. The structure 165C is coupled to the gate electrode 135 through the via 150C. The structures 165A-165C may control operation of the transistor 117 by providing electrical signals to the source contact 145A, the drain contact 145B, and the gate electrode 135. In some embodiments (e.g., embodiments where the transistor 117 is used for saving data in a memory device), the structure 165A or 165B may be a bitline of the memory device, and the structure 165C may be a wordline of the memory device.

The structures 165A-165C are coupled to the metal layer 170 through the vias 150D-150F. The distances of the structures 165A-165C to the metal layer 170 along the Y axis may be different. For instance, the structure 165A or 165B may be closer to the metal layer 170 than the structure 165B. The vias 150D and 150F may be shorter than the via 150E.

The metal layer 170 includes structures 175A-175C. The structures 175A-175C are electrically conductive. The structures 175A-175C may include one or more metals. A metal in the structures 175A-175C may be the same as the metal in the structure 165A or 165B. A metal in the structures 175A-175C may be covered by a barrier that protects the metal from being exposed to contaminants that can deteriorate the metal. The structures 175A-175C may be insulated from each other by the BEOL insulator 125. The structures 175A-175C may also be referred to as metal lines.

The structures 175A-175C are coupled to the metal layer 180 through the vias 150G and 150H. The metal layer 180 incudes structures 185A and 185B. The structures 185A and 185B may also be referred to as metal lines. The structures 185A and 185B may include one or more metals. A metal in the structures 185A and 185B may be the same as the metal in the structure 165A or 165B. A metal in the structures 185A and 185B may be covered by a barrier that protects the metal from being exposed to contaminants that can deteriorate the metal. The structures 185A and 185B may be insulated from each other by the BEOL insulator 125. In other embodiments, the metal layer 170 or 180 may include fewer, more, or different structures.

Figure 2C:
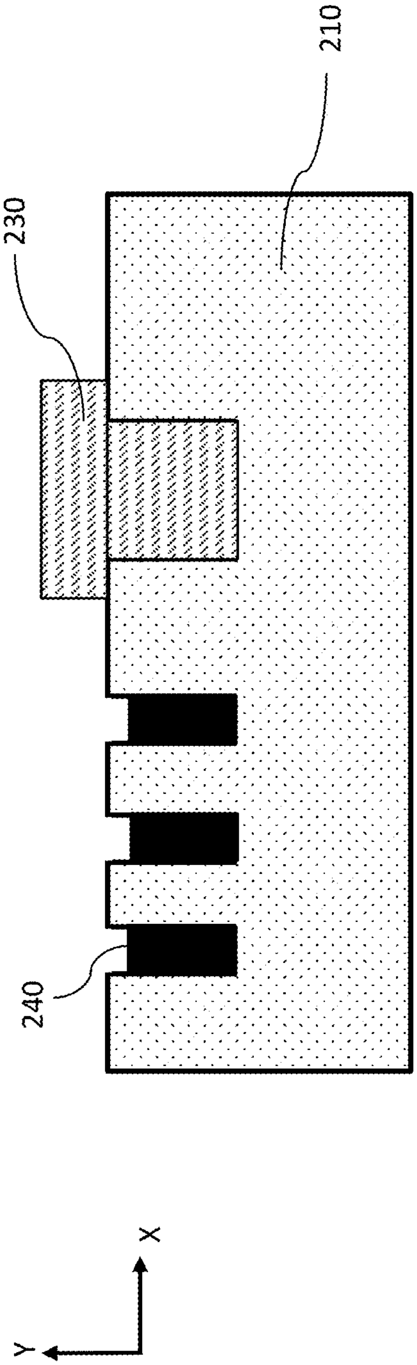
Figure 2D:
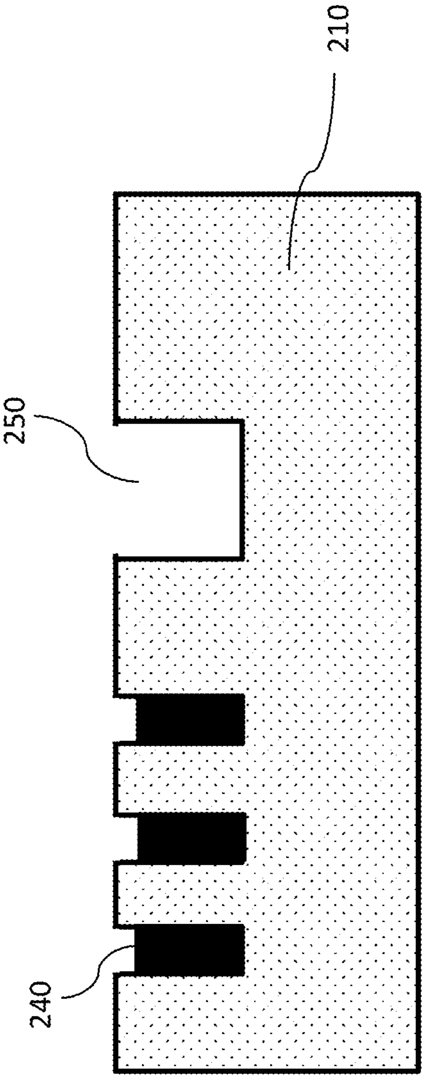
Figure 2E:
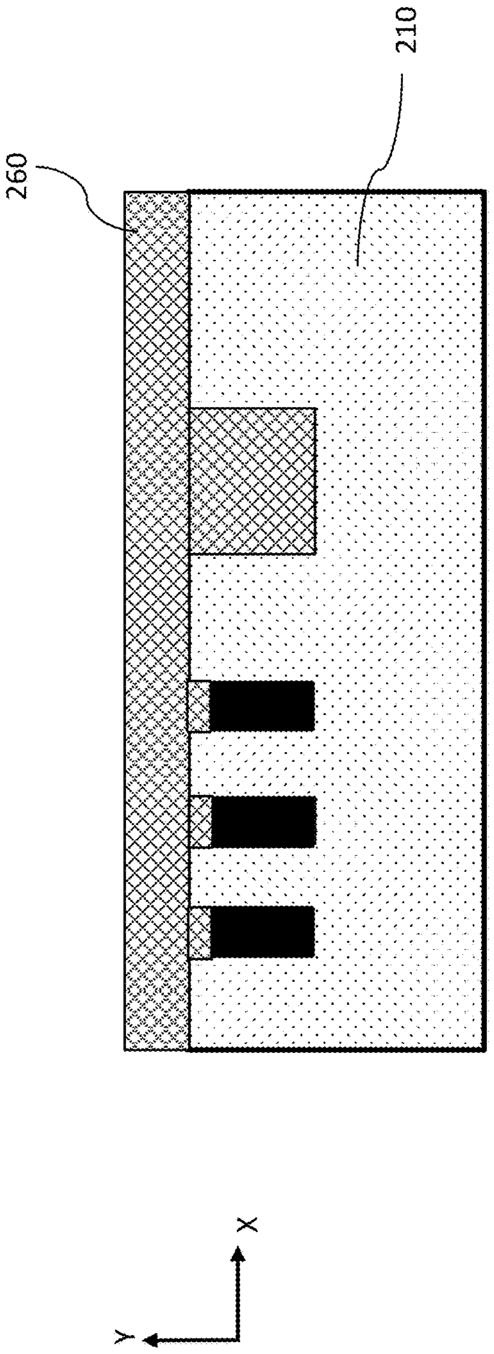

FIGS. 2A-2E illustrate an example process of forming a metal layer 200, according to some embodiments of the disclosure. The metal layer 200 is shown in FIG. 2E. The process of forming the metal layer 200 may start with a structure 210 shown in FIG. 2A. In FIG. 2A, various openings 220A-220D are formed in the structure 210. For purpose of illustration, FIG. 2A shows four openings 220A-220D. In other embodiments, a different number of openings may be formed in the structure 210. The openings 220A-220D have different dimensions. For instance, widths of the openings 220A-220D along the X axis may be different. In some embodiments, a width of an opening along the X axis may be referred to as a critical dimension. In the embodiment of FIG. 2A, the critical dimensions of the openings 220A-220C are smaller than the critical dimension of the opening 220D. Due to the differences in the critical dimensions of the openings 220A-220D, different metals may be used to make the metal layer 220.

In FIG. 2B, a structure 230 is formed in the opening 220D. The structure 230 may include a portion that is outside the opening 220D. The structure 230 can cover the opening 220D. In FIG. 2C, structures 240 (individually referred to as "structure 240") are formed in the openings 220A-220C. The structure 240 may include a metal that is selected for smaller critical dimensions. For instance, the metal may have favorable resistance for smaller critical dimensions. An example of the metal is Ru. The structures 240 may be formed by depositing the metal into the openings 220A-220C. The structure 230 prevents the metal to go into the opening 220D.

In FIG. 2D, the structure 230 is removed from the opening 220D, which forms a new opening 250. The opening 250 may have the same or similar dimensions or shape as the opening 220D. In FIG. 2E, a structure 260 is formed. The structure 260 may include another metal (e.g., Cu), which is different from the metal in the structures 240. A portion of the structure 260 fills the opening 250. Another portion of the structure 260 covers the structures 240 and portions of the structure 210.

Figure 2F:
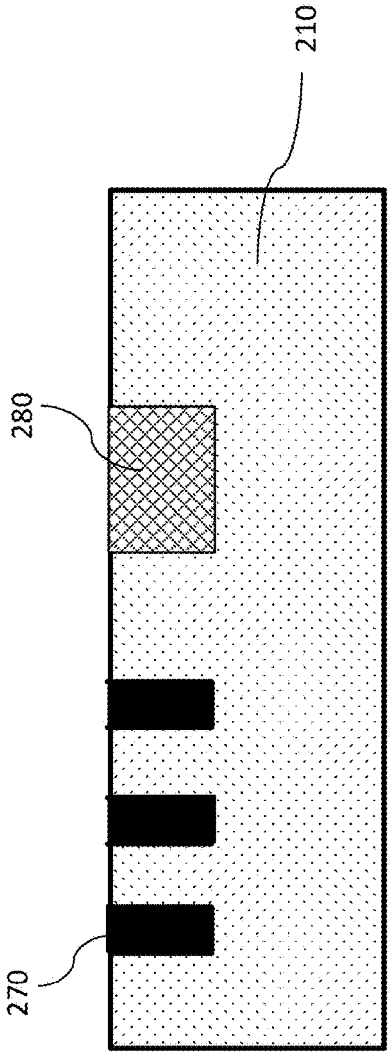

In FIG. 2F, portions of the structure 260 is removed, e.g., through polishing, so that the structures 240 are not covered by the structure 260. A part of the structure 260, which is inside the opening 250, is not removed and remain in the opening 250. The metal layer 200 is formed. The metal layer 200 includes structures 270, which are a result of polishing the structures 240. The structures 270 may have the same or similar height along the Y axis as the structures 240. The metal layer 200 also includes a structure 280, which is a portion of the structure 260. Due to the polishing process, the top surfaces of the structures 270 and the structure 280 are on the same level along the Y axis. The structures 270 and the structure 280 can have the same height. Thus, the structures 270 and the structure 280 may have the same or very similar capacitances.

The process shown in FIGS. 2A-2F have drawbacks. For example, polishing two different metals at a same time can be challenging as the polish selectivity of different metals can be different. As another example, the polishing process results in the same height of the structures 270 and the structure 280, which are not favorable in certain applications of the metal layer 200. The drawbacks can be addressed by forming a hybrid metal layer that includes metal structures of different heights, such as the hybrid metal layer 340 in FIG. 3.

Figure 3:
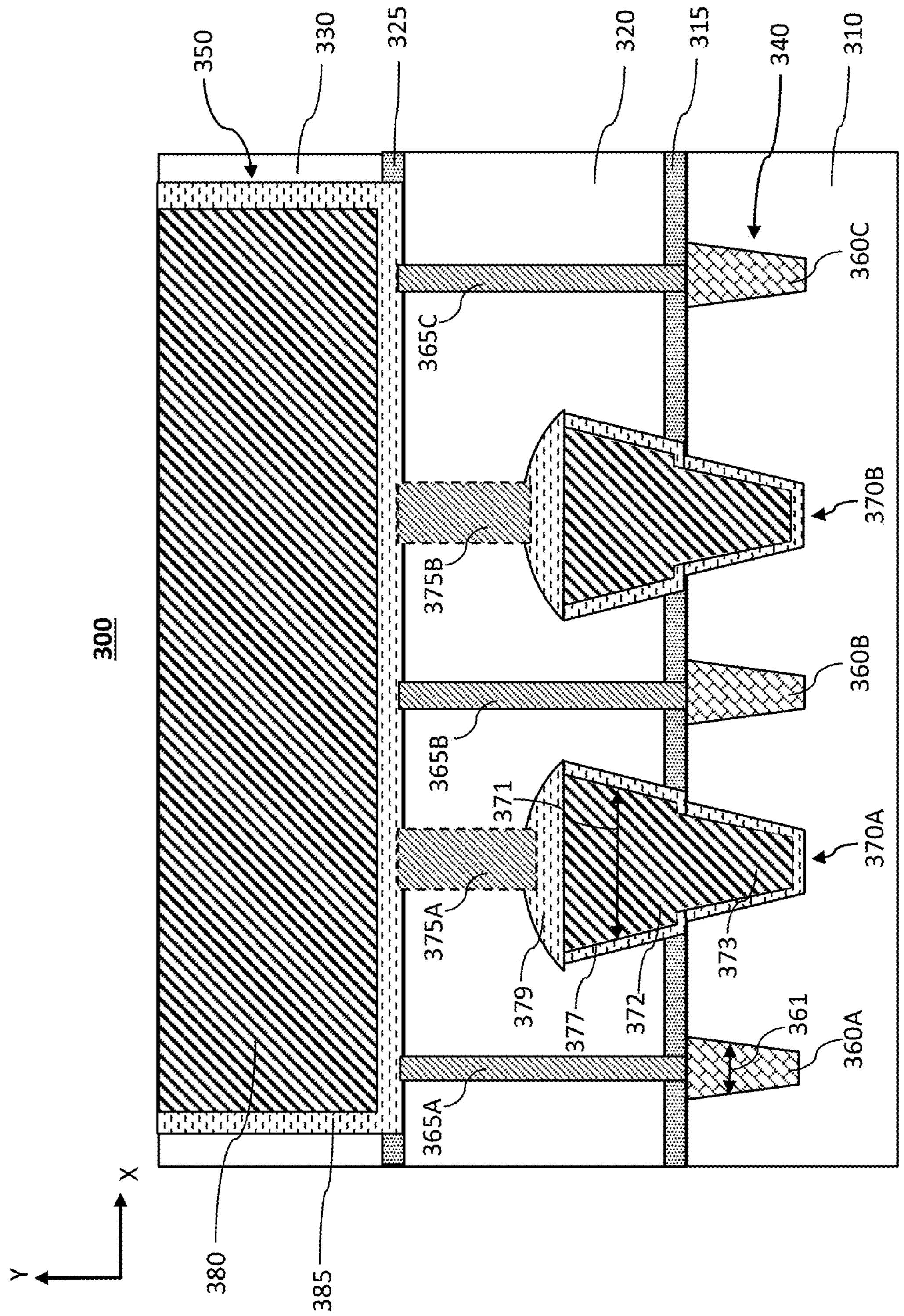
FIG. 3 illustrates an example hybrid metal layer, according to some embodiments of the disclosure.

FIG. 3 illustrates an example IC device 300 including a hybrid metal layer 340, according to some embodiments of the disclosure. The hybrid metal layer 340 also includes electrical insulators 310, 320, and 330, etch stop layers 315 and 325, a metal layer 350, and vias 365A-365C and 375A-375B. In other embodiments, the IC device 300 may include fewer, more, or different components. For instance, the IC device 300 may include one or more additional metal layers. Also, the IC device 300 may include one or more transistors. The IC device 300 may be at least part of a BEOL section of a device.

The electrical insulators 310, 320, and 330 can separate electrically conductive components in the IC device 300, e.g., components of the hybrid metal layer 340, components of the metal layer 350, and the vias 365A-365C and 375A-375B, so that some or all of the electrically conductive components are insulated from each other. The electrical insulators 310, 320, and 330 may each include an electrical insulator, such as a dielectric material, hysteretic material, and so on. Example dielectric material includes oxide (e.g., Si based oxides, metal oxides, etc.), high-k dielectric, and so on. Example hysteretic material include ferroelectric materials, antiferroelectric materials, etc. The electrical insulators 310, 320, and 330 may include different electrical insulators.

The hybrid metal layer 340 may be an electrically conductive layer that includes different structures. The hybrid metal layer 340 may be an embodiment of the metal layer 160 in FIG. 1. In the embodiments of FIG. 3, the hybrid metal layer 340 includes two groups of structures. The first group includes structures 360A-360C (collectively referred to as "structures 360" or "structure 360"). The structures 360 may have same or similar dimensions, shapes, or materials. The second group includes structures 370A-370B (collectively referred to as "structures 370" or "structure 370"). The structures 370 may have same or similar dimensions, shapes, or materials. For purpose of illustration, FIG. 3 shows three structures 360 and two structures 370. In other embodiments, the hybrid metal layer 340 may include a different number of structures 360 or 370. Each structure in the hybrid metal layer 340 may be referred to as a metal line.

A structure 360 is electrically conductive and includes an electrically conductive material. The electrically conductive material may be a metal, e.g., Ru. A width 361 of the structure 360 along the X axis may be not greater than about 12 nm. The structure 360 is arranged under the etch stop layer 315 and extends from the interface of the etch stop layer 315 and the electrical insulator 310 towards the opposite surface of the electrical insulator 310. In the embodiment of FIG. 3, the structure 360 has a trapezoid shape in the X-Y plane. In other embodiments, the structure 360 may have a different shape.

A structure 370 is electrically conductive and includes electrically conductive materials. A portion of the structure 370 is under the etch stop layer 315, and another portion of the structure 370 is above the etch stop layer 315. The portion under the etch stop layer 315 may have a height of 15-25 nm along the Y axis. The portion above the etch stop layer 315 may have a height of less than 25 nm along the Y axis. As shown in FIG. 1, the height of the structure 370 along the Y axis is greater than the corresponding height of each structure 360. In the embodiment of FIG. 3, the structure 370 has a trapezoid shape in the X-Y plane. In other embodiments, the structure 370 may have a different shape.

The structure 370 includes a metal core 372, a liner 377, and a cap 379. The metal core 372 includes a metal, e.g., Cu. The metal in the metal core 372 may be selected based on a width 371 of the structure 370. A width 371 of the structure 370 along the X axis may be more than 20 nm, e.g., the width 371 may be 20-50 nm. The metal core 372 is partially wrapped around by the liner 377. For instance, the side surface(s) and the bottom of the metal core 372 are wrapped around by the liner 377. The top of the metal core 372 is covered by the cap 379. Thus, the combination of the liner 377 and the cap 379 may enclose the metal core 372 and can separate the metal core 372 from contaminants. Examples of the contaminants may include, for example, water, air, etching chemicals, plasmas, or other matters that may deteriorate the metal core 373 during fabrication or operation of the IC device 300. The liner 377 may be a layer and may have a thickness in a range from 2-3 nm. A height of the cap 379 along the Y axis may be in a range from 3 to 4 nm. In some embodiments, the height of the cap 279 is approximately 3 nm. The liner 377 and the cap may include the same or similar electrically conductive material. The electrically conductive material may include Co. The electrically conductive material may also include one or more other materials.

The structures 360 are connected to vias 365A-365C (collectively referred to as "vias 365" or "via 365"). The structures 370 are connected to vias 375A-375B (collectively referred to as "vias 375" or "via 375"). The vias 365 are longer than the vias 375 along the Y axis. In some embodiments, the vias 365 and the vias 375 are in different planes. For instance, the vias 365 are in the X-Y plane, but the vias 375 is in a different plane, either in front of or behind the X-Y plane. In FIG. 3, the vias 375 are shown with dashed lines. Each of the vias 365 and 375 connects a component of the hybrid metal layer 340 to a component of the metal layer 350 and provide an electrically conductive channel between the two components. The vias 365 and 375 may be insulated from each other, e.g., through the electrical insulator 320. Each via may be partially or wholly wrapped by the electrical insulator 320.

In some embodiments, a via 365 or 375 is formed by forming an opening in the electrical insulator 320, e.g., through etching, to expose the hybrid metal layer 340. The etch stop layer 315 may prevent over-etching that can damage the hybrid metal layer 340. In some embodiments, a first etching process is used to etch a portion of the electrical insulator 320 and is stopped at the etch stop layer 315. A second etching process may be used to etch through the etch stop layer 315, e.g., by using a different etching gas or chemical, to expose the hybrid metal layer 340. Similarly, the etch stop layer 325 may prevent over-etching that can damage the metal layer 350, e.g., for forming vias connecting the metal layer 350 to another metal layer. In some embodiments, a first etching process is used to etch a portion of the electrical insulator 320 and is stopped at the etch stop layer 325. A second etching process may be used to etch through the etch stop layer 325, e.g., by using a different etching gas or chemical, to expose the metal layer 350. The etch stop layer 315 or 325 may include silicon nitride, silicon carbide, silicon carbonitride, and so on.

The metal layer 350 may be an electrically conductive layer. The metal layer 350 is coupled to the hybrid metal layer 340 through the vias 365 and 375. The metal layer 350 includes a metal core 380 and a liner 385. The metal core 380 includes a metal. The metal in the metal core 380 may be the same as the metal in the metal core 372 of the structures 370. The liner 385 may enclose at least part of the metal core 380. The liner 385 may include the same or similar material(s) as the liner 377 in the hybrid metal layer 340.

In some embodiments, the hybrid metal layer 340 may be the first metal layer in a BEOL of a device, such as a complementary metal-oxide semiconductor (CMOS) device. The metal layer 350 may be the second metal layer in the BEOL. The hybrid metal layer 340 may be referred to as M0, and the metal layer 350 may be referred to as M1. The hybrid metal layer 340 may be closer to the FEOL where one or more semiconductor devices are arranged.

Figure 4A:
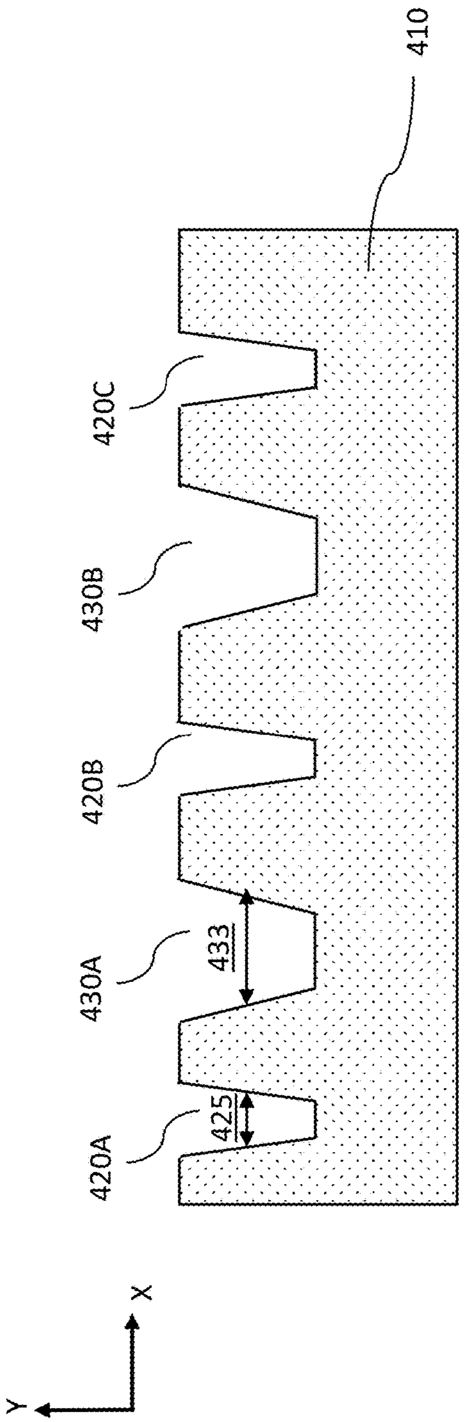
FIGS. 4A-4J illustrate a process of forming a hybrid metal layer, according to some embodiments of the disclosure.
Figure 4B:
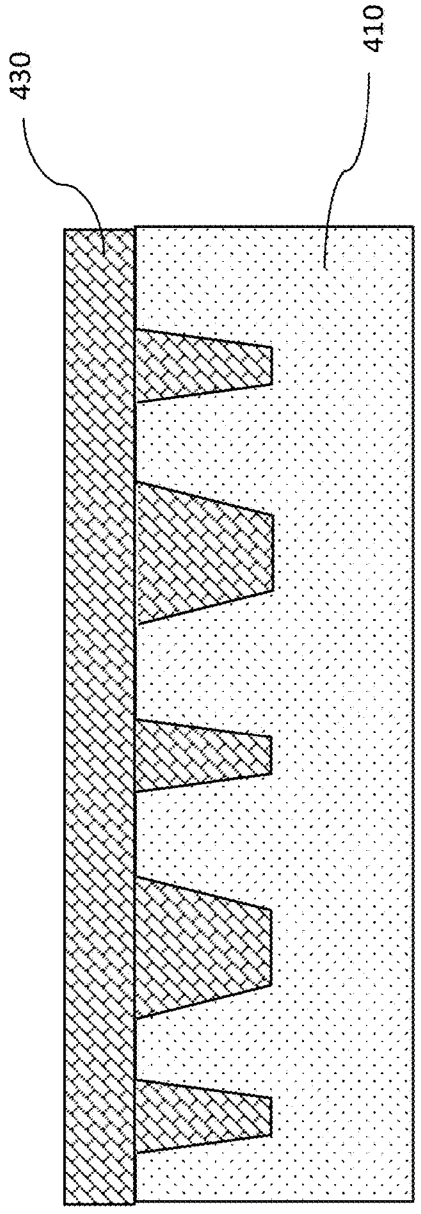
Figure 4C:
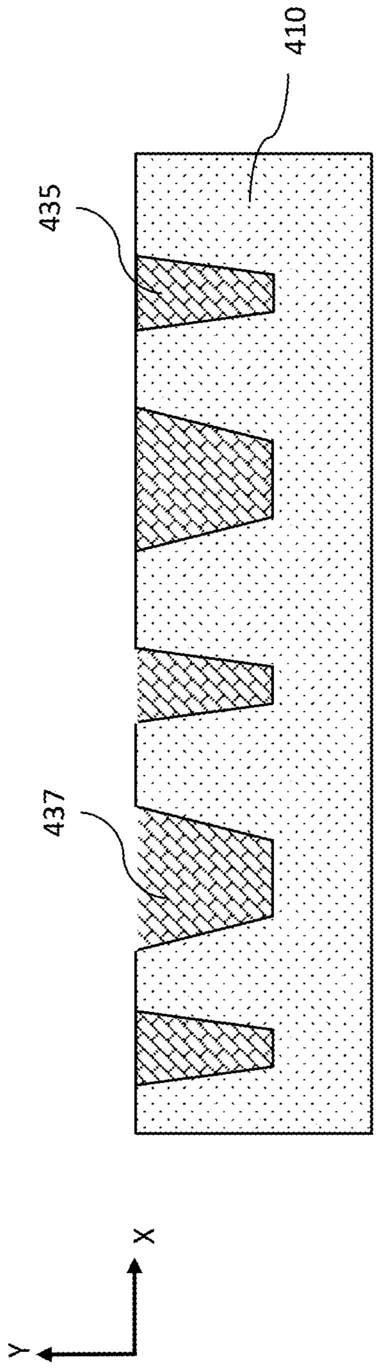
Figure 4D:
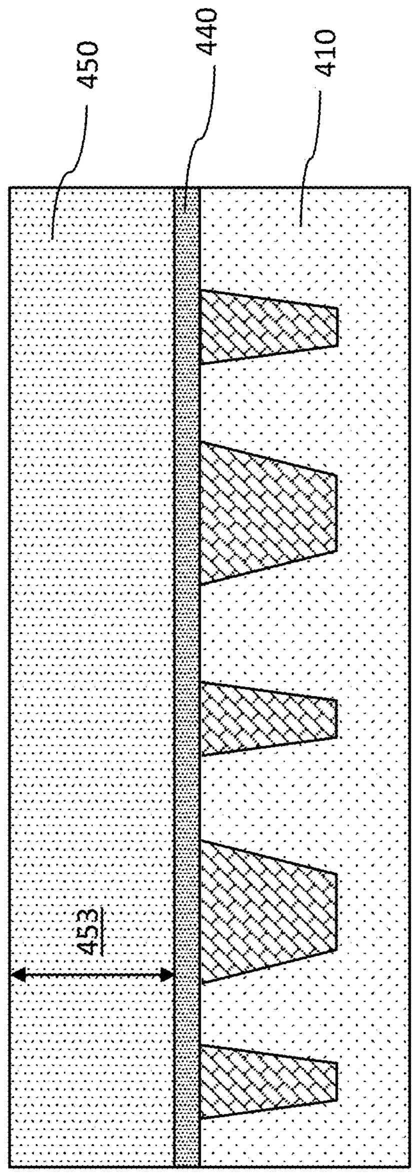
Figure 4E:
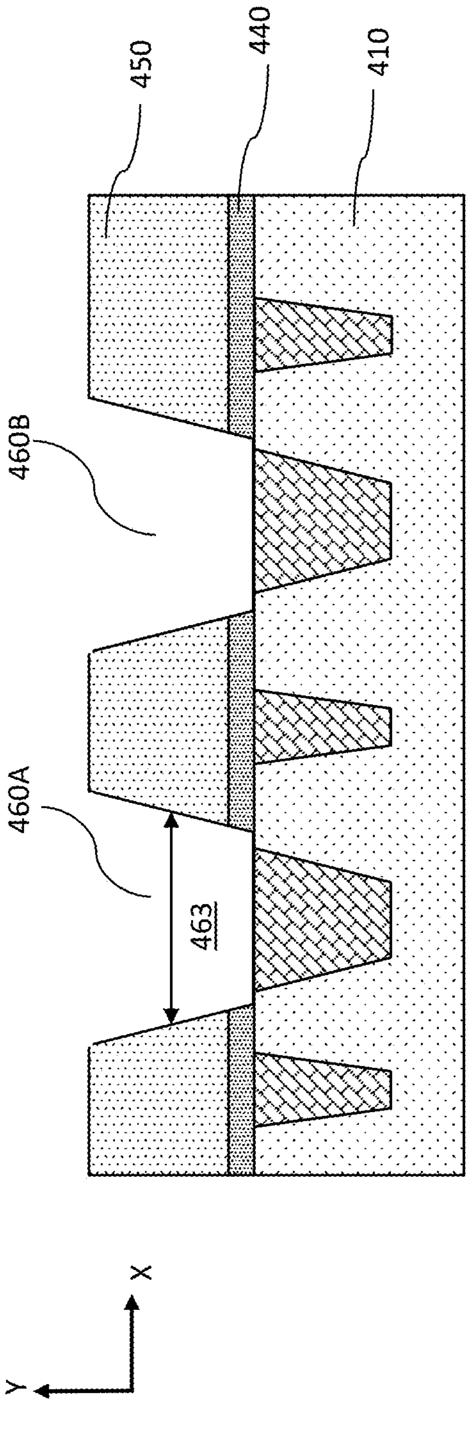
Figure 4F:
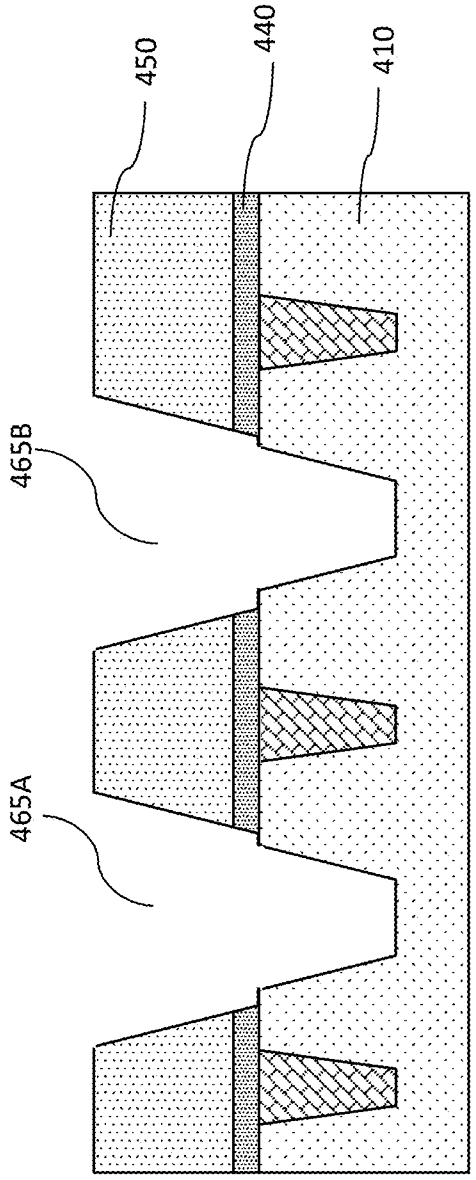
Figure 4G:
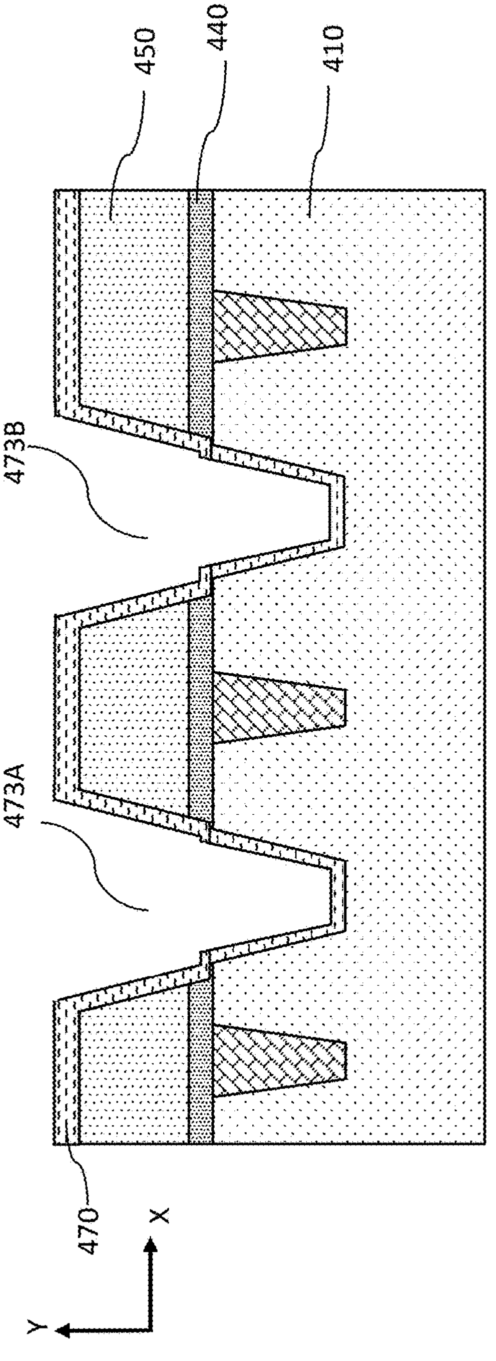
Figure 4H:
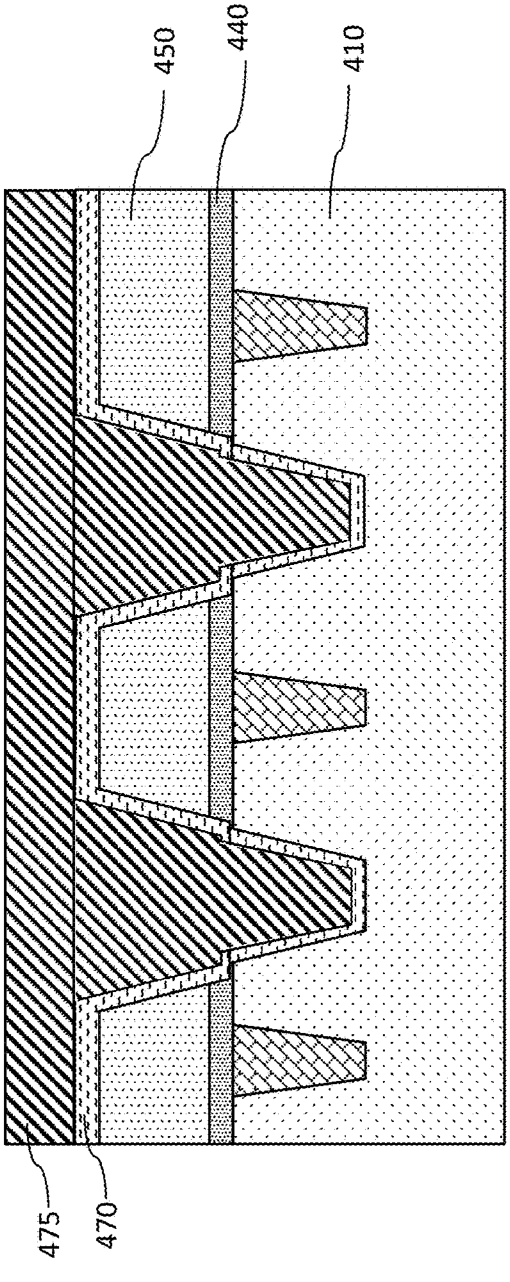
Figure 4I:
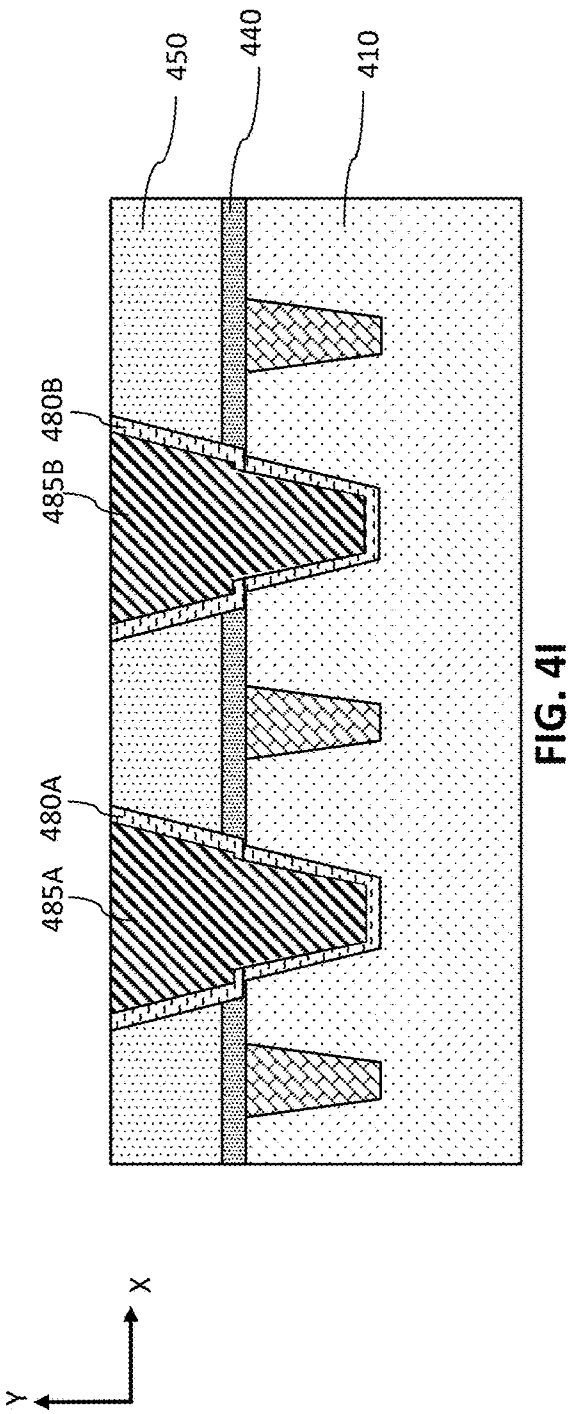
Figure 4J:
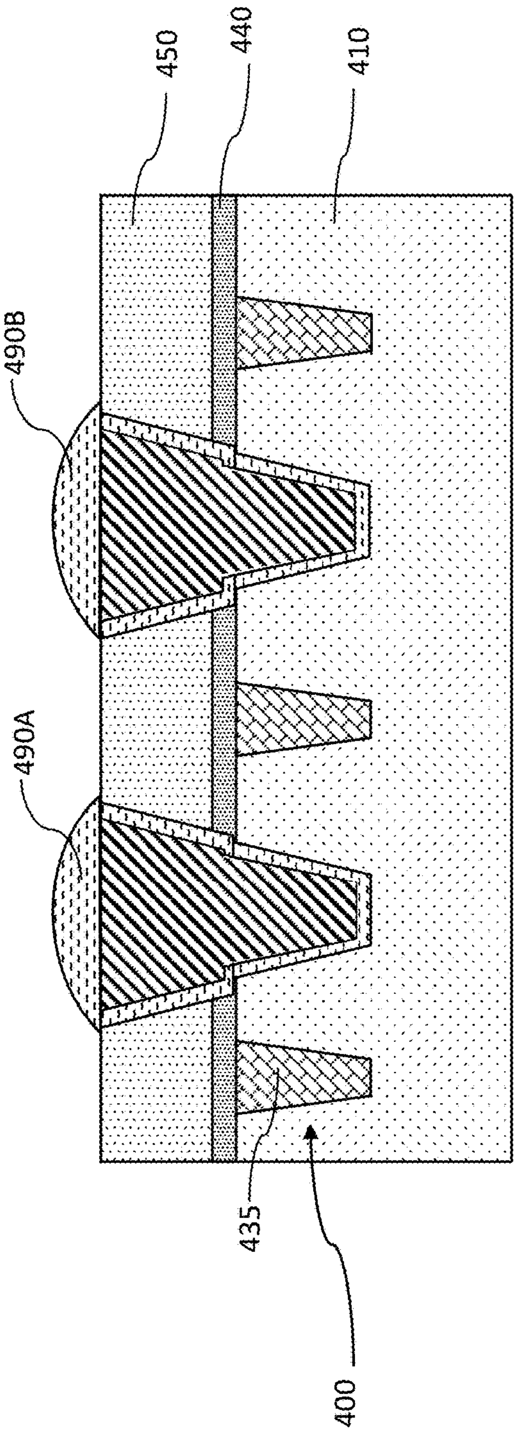

FIGS. 4A-4J illustrate a process of forming a hybrid metal layer 400, according to some embodiments of the disclosure. The hybrid metal layer 400 is shown in FIG. 4J. The hybrid metal layer 400 may be an embodiment of the hybrid metal layer 340 in FIG. 3.

FIG. 4A shows a layer 410. The layer 410 is a layer including an electrical insulator. The layer 410 may be an embodiment of the electrical insulator 310 in FIG. 3. Various openings 420A-420C and 430A-430B are formed in the layer 410. In some embodiments, the openings 420A-420C and 430A-430B are formed through lithography (e.g., photo lithography) and etching. For instance, the lithography may define the locations and sizes of the openings 420A-420C and 430A-430B. The etching can form the openings 420A-420C and 430A-430B based on the locations and sizes determined by the lithography. The openings 420A-420C and 430A-430B have different sizes in FIG. 4A. For instance, critical dimensions of the openings 420A-420C are greater than critical dimensions of the openings 430A-430B. A critical dimension of an opening may be a width of the opening in a direction along the X axis. The openings 420A-420C have a width 425. The width 425 may be no greater than 12 nm. The openings 430A-430B have a width 433. The width 433 may be greater than 12 nm. In an example, the width 433 may be 20-50 nm. The openings 420A-420C may have a tighter pitch than the openings 430A-430B.

In FIG. 4B, a metal 430 is added. The metal may be Ru. The metal may be added through a deposition or electroplating. As shown in FIG. 4B, the metal 430 fills all the openings 420A-420C and 430A-430B and covers a top surface of the layer 410. In FIG. 4C, some of the metal 430 is removed, e.g., by polishing. As a result of the polishing, structures 435 and 437 are formed. The structures 435 (individually referred to as "structure 435") are formed in the openings 420A-420C. The structures 437 (individually referred to as "structure 437") are formed in the openings 430A-430B. As the openings 420A-420C and 430A-430B have different widths, the structures 435 and 437 also have different widths.

In FIG. 4D, an etch stop layer 440 is formed on top of the layer 410 and contacts with the top surfaces of the structures 435 and 437. The etch stop layer 440 may be an embodiment of the etch stop layer 315 in FIG. 3. Also, a layer 450 is formed over the etch stop layer 315. The layer 450 may be a layer of an electrical insulator and may be an embodiment of the electrical insulator 320 in FIG. 3. The etch stop layer 440 or the layer 450 may be formed through deposition, e.g., electrospray deposition, interlayer dielectric deposition, other types of deposition, or some combination thereof. A height 453 of the layer 450 in a direction along the Y axis may be in a range from 15 to 25 nm.

In FIG. 4E, openings 460A-460B are formed in the layer 450. The openings 460A and 460B are over the structures 437 formed in the layer 410. The openings 460A-460B may be formed through etching. In an example, portions of the layer 450 are removed in a first etching process until it reaches the etch stop layer 440. The corresponding portions of the etch stop layer 440 are etched in a second etching process to expose the structures 435 and 437. The openings 460A-460B may have the same or similar width along the X axis. A width 463 of the openings 460A-460B may be in a range from 20 to 50 nm.

In FIG. 4F, the structures 435 and 437 are removed and openings 465A-465B are formed. In some embodiments, the structures 435 and 437 may be removed through dry etch. There may be a via (e.g., a via coupled to a transistor) under at least one of the structures 435 and 437. The via may remain intact during the process of removing the structures 435 and 437.

In FIG. 4G, a liner 470 is formed. The liner 470 covers the surfaces of the openings 465A-465B. The liner 470 also covers portions of the top surface of the layer 450 that are exposed. In some embodiments, the liner 470 includes one or more electrically conductive material. The one or more electrically conductive material may include Co. A thickness of the liner 470 may be 2-3 nm. With the presence of the liner 470, new openings 473A-473B are formed.

In FIG. 4H, a metal 475 is deposited over the liner 470. The metal 475 may be Cu. Some portions of the metal 475 fills the openings 473A-473B. Some other portions of the metal 475 are outside the openings 473A-473B and are over the layer 450.

In FIG. 4I, a polishing process is performed to remove undesired portions of the liner 470 and undesired portions of the metal 475. After the polishing process, the structures 480A and 480B and 485A-485B are formed. The structures 480A and 480B are portions of the liner 470 that are not removed by the polish. The structures 485A and 485B are portions of the metal 475 that are not removed by the polish. The structures 485A and 485B are wrapped around by structures 480A and 480B, respectively. As shown in FIG. 4I, some portions of the top surface of the layer 450 are exposed after the polish. The top surfaces of the structures 485A and 485B are at the same (or substantially similar) level along the Y axis as the top surface of the layer 450.

In FIG. 4J, caps 490A and 490B are formed on top of the structures 485A and 485B, respectively. A length of the caps 490A-490B in a direction along the X axis may be equal to or great than a length of the structures 485A-485B in the direction along the X axis. The structure 485A may be enclosed by the structure 480A and the cap 490A. The structure 485B may be enclosed by the structure 480B and the cap 490B. The structures 435, structures 480A-480B, structures 485A-485B, caps 490A-490B may constitute the hybrid metal layer 400.

Figure 5A:
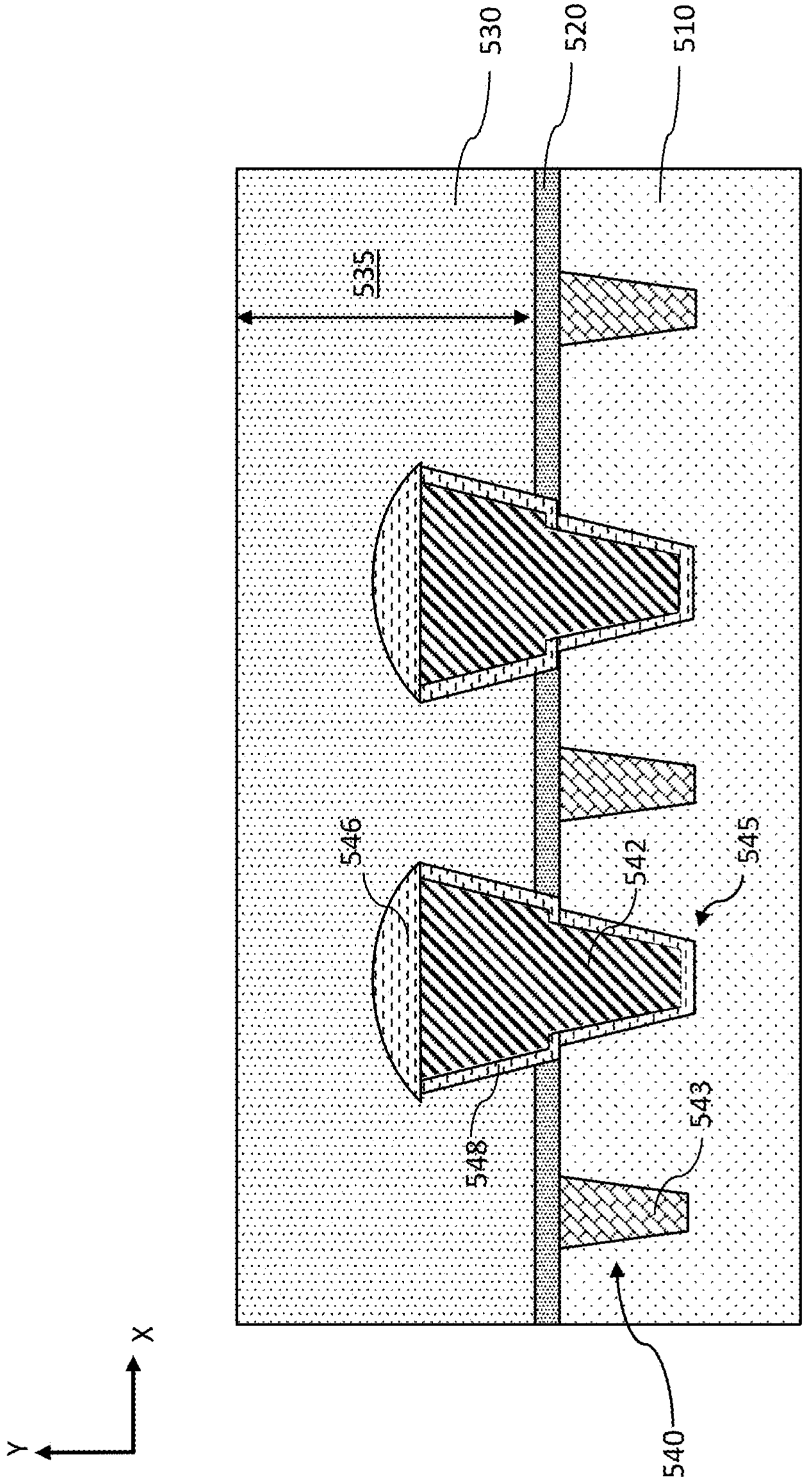
FIGS. 5A-5B illustrate a process of forming vias connected to a hybrid metal layer, according to some embodiments of the disclosure.
Figure 5B:
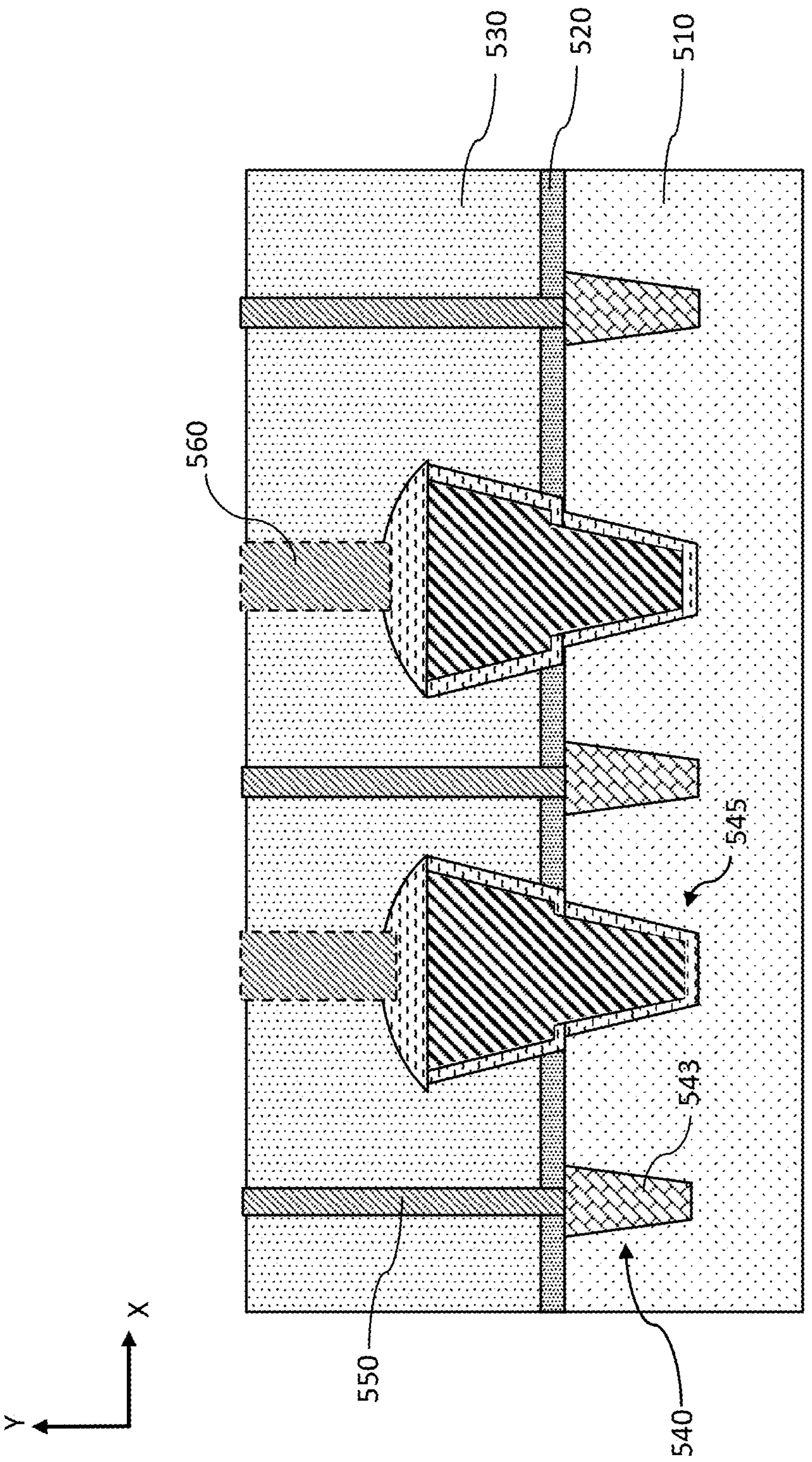

FIGS. 5A-5B illustrate a process of forming vias 550 and 560 connected to a hybrid metal layer 540, according to some embodiments of the disclosure. The hybrid metal layer 540 may be an embodiment of the hybrid metal layer 340 in FIG. 3 or the hybrid metal layer 400 in FIG. 4. As shown in FIG. 5A, different portions of the hybrid metal layer 540 are wrapped by layers 510, 520, and 530. The layers 510, 520, and 530 may each include an electrical insulator. The layer 530 may also function as an etch stop. The layer 510 may be an embodiment of the layer 410 in FIGS. 4A-4J. The layer 520 may be an embodiment of the layer 440 in FIGS. 4A-4J. A portion of the layer 530 may be an embodiment of the layer 450 in FIGS. 4A-4J.

The hybrid metal layer 540 includes three structures 543 (individually referred to as "structure 543") and two structures 545 (individually referred to as "structure 545"). A structure 543 may have different dimension, shape, and material from a structure 545. A structure 545 includes structures 542, 546, and 548. The structure 542 may be an embodiment of the metal core 373 in FIG. 3 or the structure 435 in FIGS. 4A-4J. The structure 546 may be an embodiment of the cap 379 in FIG. 3 or the caps 490A or 490B in FIGS. 4A-4J. The structure 548 may be an embodiment of the liner 377 in FIG. 3 or the structure 480A or 480B in FIGS. 4A-4J.

In some embodiments, the process in FIGS. 5A and 5B is performed after the process in FIGS. 4A-4J. A first portion of the layer 530 may be the layer 450 in FIG. 4J. In FIG. 5A, a second portion of the layer 530 is formed on top of the first portion, e.g., through deposition. The deposition may be electrospray deposition, interlayer dielectric deposition, other types of deposition, or some combination thereof. The first portion and the second portion may include similar or same material(s). A height (or thickness) of the layer 530 in a direction along the Y axis may be less than 40 nm. The second portion is formed to facilitate formation of the vias 550 and 560.

In FIG. 5B, the vias 550 and 560 are formed. Each of the vias 550 and 560 may be at least partially inside the layer 530. FIG. 5B shows three vias 550 that are connected to the structures 543 and two vias 560 that are connected to the structures 545 (particularly to the structures 546 in the structures 545). The vias 550 may have different dimensions from the vias 560. Also, the vias 550 may be located in the same plane (e.g., the X-Y plane), which may be different from the plane where the vias 560 are located.

The vias 550 and 560 may be formed through lithography, which can determine sizes and locations of the vias 550 and 560 on the top surface of the layer 530. Then openings in the layer 530 may be formed at the locations through etch. For the openings for the vias 550, the etch can etch through the layer 520 and reach the structures 543. The openings for the vias 550 and 560 may be formed in a same etching processing. In some embodiments, the etching may be selective chemical etching, in which the material (e.g., electrical insulator) in the layer 530 is selectively etched, and the structures 546 are minimally etched or not etched at all. The structure 546 may have sufficient height (e.g., approximately 3-4 nm) in a direction along the Y axis so that even if a portion of the structure 546 is etched, the rest of the structure 546 can be sufficient to provide the barrier to the structure 542. The etching rate of a material in the layer 530 is higher than an etching rate of a material in the structures 546. After the openings are formed, the vias 550 and 560 can be formed by providing an electrically conductive material, e.g., a metal into the openings. The configuration of the hybrid metal layer 540 allows the vias 550 and 560 to be formed through the same lithography process and same etching process.

Figure 6B:
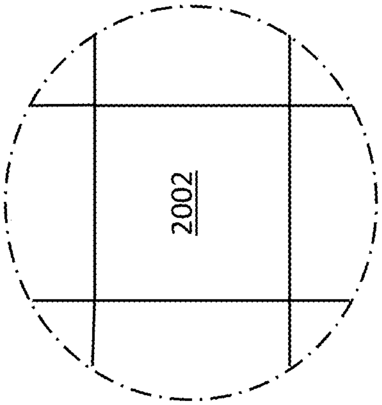
FIGS. 6A-6B are top views of a wafer and dies that may include one or more varactor devices with backside electrical contact, according to some embodiments of the disclosure.
Figure 6A:
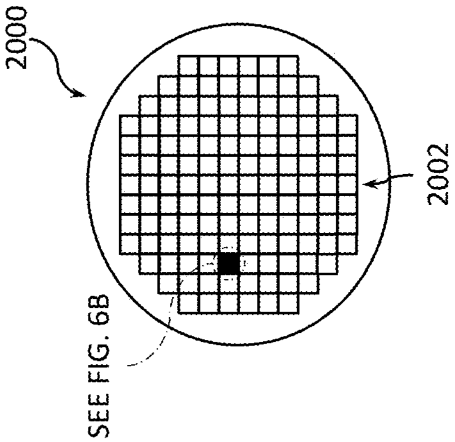

FIGS. 6A-6B are top views of a wafer 2000 and dies 2002 that may include one or more varactor devices with backside electrical contact, according to some embodiments of the disclosure. In some embodiments, the dies 2002 may be included in an IC package, according to some embodiments of the disclosure. For example, any of the dies 2002 may serve as any of the dies 2256 in an IC package 2200 shown in FIG. 7. The wafer 2000 may be composed of semiconductor material and may include one or more dies 2002 having IC devices formed on a surface of the wafer 2000. Each of the dies 2002 may be a repeating unit of a semiconductor product that includes any suitable IC (e.g., ICs including one or more varactor devices as described herein). After the fabrication of the semiconductor product is complete (e.g., after manufacture of one or more varactor devices as described herein), the wafer 2000 may undergo a singulation process in which each of the dies 2002 is separated from one another to provide discrete "chips" of the semiconductor product. In particular, devices that include one or more varactor devices as disclosed herein may take the form of the wafer 2000 (e.g., not singulated) or the form of the die 2002 (e.g., singulated). The die 2002 may include one or more diodes (e.g., one or more varactor devices as described herein), one or more transistors (e.g., one or more III-N transistors as described herein) as well as, optionally, supporting circuitry to route electrical signals to the III-N diodes with n-doped wells and capping layers and III-N transistors, as well as any other IC components. In some embodiments, the wafer 2000 or the die 2002 may implement an electrostatic discharge (ESD) protection device, a radio frequency front-end device, a memory device (e.g., a static random-access memory (SRAM) device), a logic device (e.g., an AND, OR, NAND, or NOR gate), or any other suitable circuit element. Multiple ones of these devices may be combined on a single die 2002.

Figure 7:
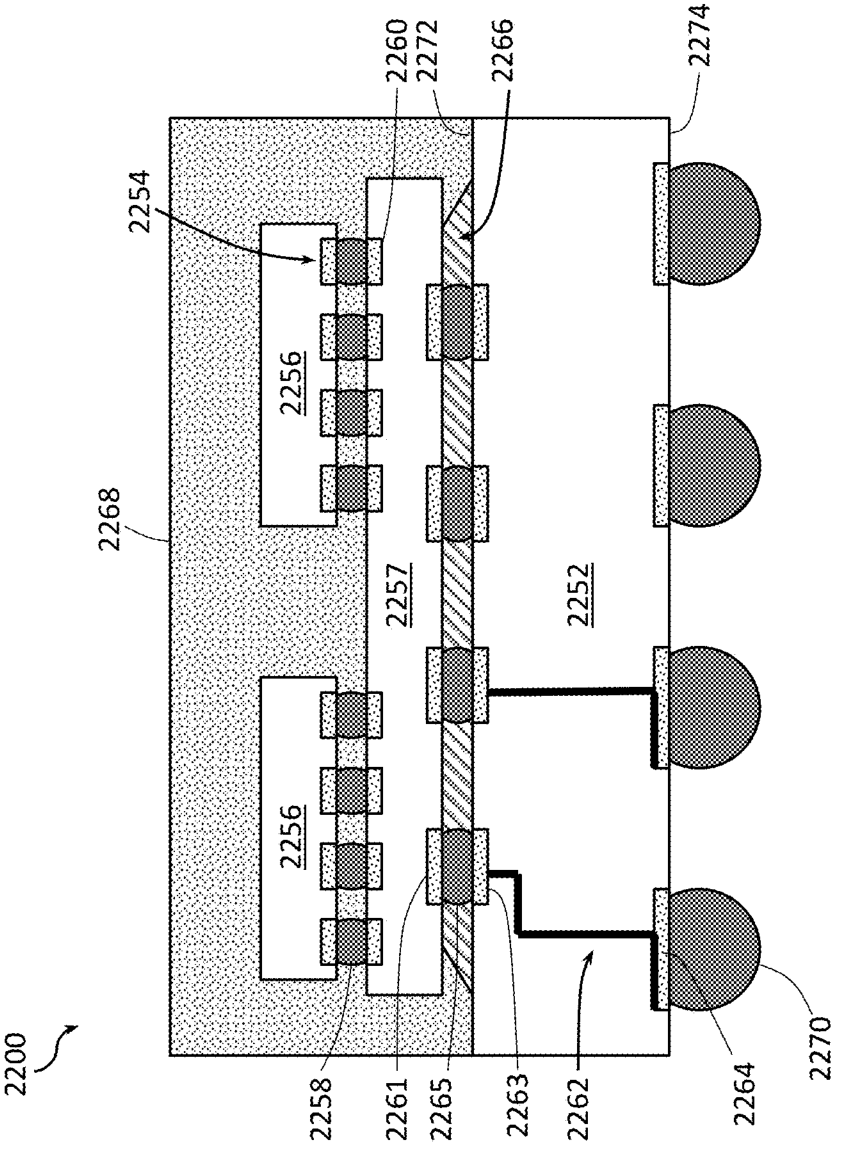
FIG. 7 is a side, cross-sectional view of an example IC package that may include one or more IC devices having varactor devices with backside electrical contact, according to some embodiments of the disclosure.

FIG. 7 is a side, cross-sectional view of an example IC package 2200 that may include one or more IC devices having varactor devices with backside electrical contact, according to some embodiments of the disclosure. In some embodiments, the IC package 2200 may be a system-in-package (SiP).

As shown in FIG. 7, the IC package 2200 may include a package substrate 2252. The package substrate 2252 may be formed of a dielectric material (e.g., a ceramic, a glass, a combination of organic and inorganic materials, a buildup film, an epoxy film having filler particles therein, etc., and may have embedded portions having different materials), and may have conductive pathways extending through the dielectric material between the face 2272 and the face 2274, or between different locations on the face 2272, and/or between different locations on the face 2274.

The package substrate 2252 may include conductive contacts 2263 that are coupled to conductive pathways 2262 through the package substrate 2252, allowing circuitry within the dies 2256 and/or the interposer 2257 to electrically couple to various ones of the conductive contacts 2264 (or to other devices included in the package substrate 2252, not shown).

The IC package 2200 may include an interposer 2257 coupled to the package substrate 2252 via conductive contacts 2261 of the interposer 2257, first-level interconnects 2265, and the conductive contacts 2263 of the package substrate 2252. The first-level interconnects 2265 illustrated in FIG. 7 are solder bumps, but any suitable first-level interconnects 2265 may be used. In some embodiments, no interposer 2257 may be included in the IC package 2200; instead, the dies 2256 may be coupled directly to the conductive contacts 2263 at the face 2272 by first-level interconnects 2265.

The IC package 2200 may include one or more dies 2256 coupled to the interposer 2257 via conductive contacts 2254 of the dies 2256, first-level interconnects 2258, and conductive contacts 2260 of the interposer 2257. The conductive contacts 2260 may be coupled to conductive pathways (not shown) through the interposer 2257, allowing circuitry within the dies 2256 to electrically couple to various ones of the conductive contacts 2261 (or to other devices included in the interposer 2257, not shown). The first-level interconnects 2258 illustrated in FIG. 7 are solder bumps, but any suitable first-level interconnects 2258 may be used. As used herein, a "conductive contact" may refer to a portion of electrically conductive material (e.g., metal) serving as an interface between different components; conductive contacts may be recessed in, flush with, or extending away from a surface of a component, and may take any suitable form (e.g., a conductive pad or socket).

In some embodiments, an underfill material 2266 may be disposed between the package substrate 2252 and the interposer 2257 around the first-level interconnects 2265, and a mold compound 2268 may be disposed around the dies 2256 and the interposer 2257 and in contact with the package substrate 2252. In some embodiments, the underfill material 2266 may be the same as the mold compound 2268. Example materials that may be used for the underfill material 2266 and the mold compound 2268 are epoxy mold materials, as suitable. Second-level interconnects 2270 may be coupled to the conductive contacts 2264. The second-level interconnects 2270 illustrated in FIG. 7 are solder balls (e.g., for a ball grid array arrangement), but any suitable second-level interconnects 22770 may be used (e.g., pins in a pin grid array arrangement or lands in a land grid array arrangement). The second-level interconnects 2270 may be used to couple the IC package 2200 to another component, such as a circuit board (e.g., a motherboard), an interposer, or another IC package, as known in the art and as discussed below with reference to FIG. 8.

The dies 2256 may take the form of any of the embodiments of the die 2002 discussed herein and may include any of the embodiments of an IC device having one or more varactor devices. In embodiments in which the IC package 2200 includes multiple dies 2256, the IC package 2200 may be referred to as a multi-chip package. Importantly, even in such embodiments of an MCP implementation of the IC package 2200, one or more varactor devices may be provided in a single chip, in accordance with any of the embodiments described herein. The dies 2256 may include circuitry to perform any desired functionality. For example, one or more of the dies 2256 may be ESD protection dies, including one or more varactor devices as described herein, one or more of the dies 2256 may be logic dies (e.g., silicon-based dies), one or more of the dies 2256 may be memory dies (e.g., high bandwidth memory), etc. In some embodiments, any of the dies 2256 may include one or more varactor devices, e.g., as discussed above; in some embodiments, at least some of the dies 2256 may not include any III-N diodes with n-doped wells and capping layers.

The IC package 2200 illustrated in FIG. 7 may be a flip chip package, although other package architectures may be used. For example, the IC package 2200 may be a ball grid array (BGA) package, such as an embedded wafer-level ball grid array (eWLB) package. In another example, the IC package 2200 may be a wafer-level chip scale package (WLCSP) or a panel fan-out (FO) package. Although two dies 2256 are illustrated in the IC package 2200 of FIG. 7, an IC package 2200 may include any desired number of the dies 2256. An IC package 2200 may include additional passive components, such as surface-mount resistors, capacitors, and inductors disposed on the first face 2272 or the second face 2274 of the package substrate 2252, or on either face of the interposer 2257. More generally, an IC package 2200 may include any other active or passive components known in the art.

Figure 8:
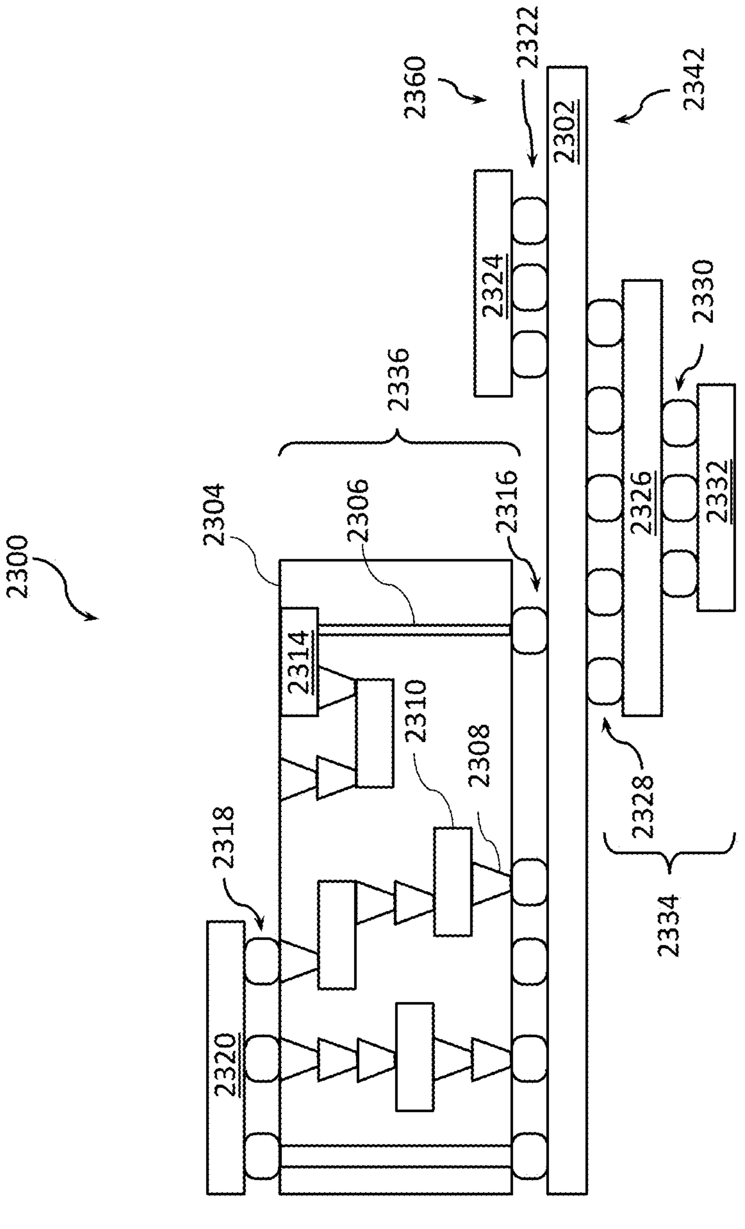
FIG. 8 is a cross-sectional side view of an IC device assembly that may include components having one or more IC devices implementing varactor devices with backside electrical contact, according to some embodiments of the disclosure.

FIG. 8 is a cross-sectional side view of an IC device assembly 2300 that may include components having one or more IC devices implementing varactor devices with back-side electrical contact, according to some embodiments of the disclosure. The IC device assembly 2300 includes a number of components disposed on a circuit board 2302 (which may be, e.g., a motherboard). The IC device assembly 2300 includes components disposed on a first face 2340 of the circuit board 2302 and an opposing second face 2342 of the circuit board 2302; generally, components may be disposed on one or both faces 2340 and 2342. In particular, any suitable ones of the components of the IC device assembly 2300 may include any of the IC devices implementing one or more varactor devices in accordance with any of the embodiments disclosed herein; e.g., any of the IC packages discussed below with reference to the IC device assembly 2300 may take the form of any of the embodiments of the IC package 2200 discussed above with reference to FIG. 7 (e.g., may include one or more varactor devices in/on a die 2256).

In some embodiments, the circuit board 2302 may be a PCB including multiple metal layers separated from one another by layers of dielectric material and interconnected by electrically conductive vias. Any one or more of the metal layers may be formed in a desired circuit pattern to route electrical signals (optionally in conjunction with other metal layers) between the components coupled to the circuit board 2302. In other embodiments, the circuit board 2302 may be a non-PCB substrate.

The IC device assembly 2300 illustrated in FIG. 8 includes a package-on-interposer structure 2336 coupled to the first face 2340 of the circuit board 2302 by coupling components 2316. The coupling components 2316 may electrically and mechanically couple the package-on-interposer structure 2336 to the circuit board 2302, and may include solder balls (e.g., as shown in FIG. 8), male and female portions of a socket, an adhesive, an underfill material, and/or any other suitable electrical and/or mechanical coupling structure.

The package-on-interposer structure 2336 may include an IC package 2320 coupled to an interposer 2304 by coupling components 2318. The coupling components 2318 may take any suitable form for the application, such as the forms discussed above with reference to the coupling components 2316. The IC package 2320 may be or include, for example, a die (the die 2002 of FIG. 6B), an IC device (e.g., the IC device of FIGS. 1-2), or any other suitable component. In particular, the IC package 2320 may include one or more varactor devices as described herein. Although a single IC package 2320 is shown in FIG. 8, multiple IC packages may be coupled to the interposer 2304; indeed, additional interposers may be coupled to the interposer 2304. The interposer 2304 may provide an intervening substrate used to bridge the circuit board 2302 and the IC package 2320. Generally, the interposer 2304 may spread a connection to a wider pitch or reroute a connection to a different connection. For example, the interposer 2304 may couple the IC package 2320 (e.g., a die) to a BGA of the coupling components 2316 for coupling to the circuit board 2302. In the embodiment illustrated in FIG. 8, the IC package 2320 and the circuit board 2302 are attached to opposing sides of the interposer 2304; in other embodiments, the IC package 2320 and the circuit board 2302 may be attached to a same side of the interposer 2304. In some embodiments, three or more components may be interconnected by way of the interposer 2304.

The interposer 2304 may be formed of an epoxy resin, a fiberglass-reinforced epoxy resin, a ceramic material, or a polymer material such as polyimide. In some implementations, the interposer 2304 may be formed of alternate rigid or flexible materials that may include the same materials described above for use in a semiconductor substrate, such as silicon, germanium, and other group III-V and group IV materials. The interposer 2304 may include metal interconnects 2308 and vias 2310, including but not limited to TSVs 2306. The interposer 2304 may further include embedded devices 2314, including both passive and active devices. Such devices may include, but are not limited to, capacitors, decoupling capacitors, resistors, inductors, fuses, diodes, transformers, sensors, ESD protection devices, and memory devices. More complex devices such as further RF devices, power amplifiers, power management devices, antennas, arrays, sensors, and microelectromechanical systems (MEMS) devices may also be formed on the interposer 2304. In some embodiments, the IC devices implementing one or more varactor devices as described herein may also be implemented in/on the interposer 2304. The package-on-interposer structure 2336 may take the form of any of the package-on-interposer structures known in the art.

The IC device assembly 2300 may include an IC package 2324 coupled to the first face 2340 of the circuit board 2302 by coupling components 2322. The coupling components 2322 may take the form of any of the embodiments discussed above with reference to the coupling components 2316, and the IC package 2324 may take the form of any of the embodiments discussed above with reference to the IC package 2320.

The IC device assembly 2300 illustrated in FIG. 8 includes a package-on-package structure 2334 coupled to the second face 2342 of the circuit board 2302 by coupling components 2328. The package-on-package structure 2334 may include an IC package 2326 and an IC package 2332 coupled together by coupling components 2330 such that the IC package 2326 is disposed between the circuit board 2302 and the IC package 2332. The coupling components 2328 and 2330 may take the form of any of the embodiments of the coupling components 2316 discussed above, and the IC packages 2326 and 2332 may take the form of any of the embodiments of the IC package 2320 discussed above. The package-on-package structure 2334 may be configured in accordance with any of the package-on-package structures known in the art.

Figure 9:
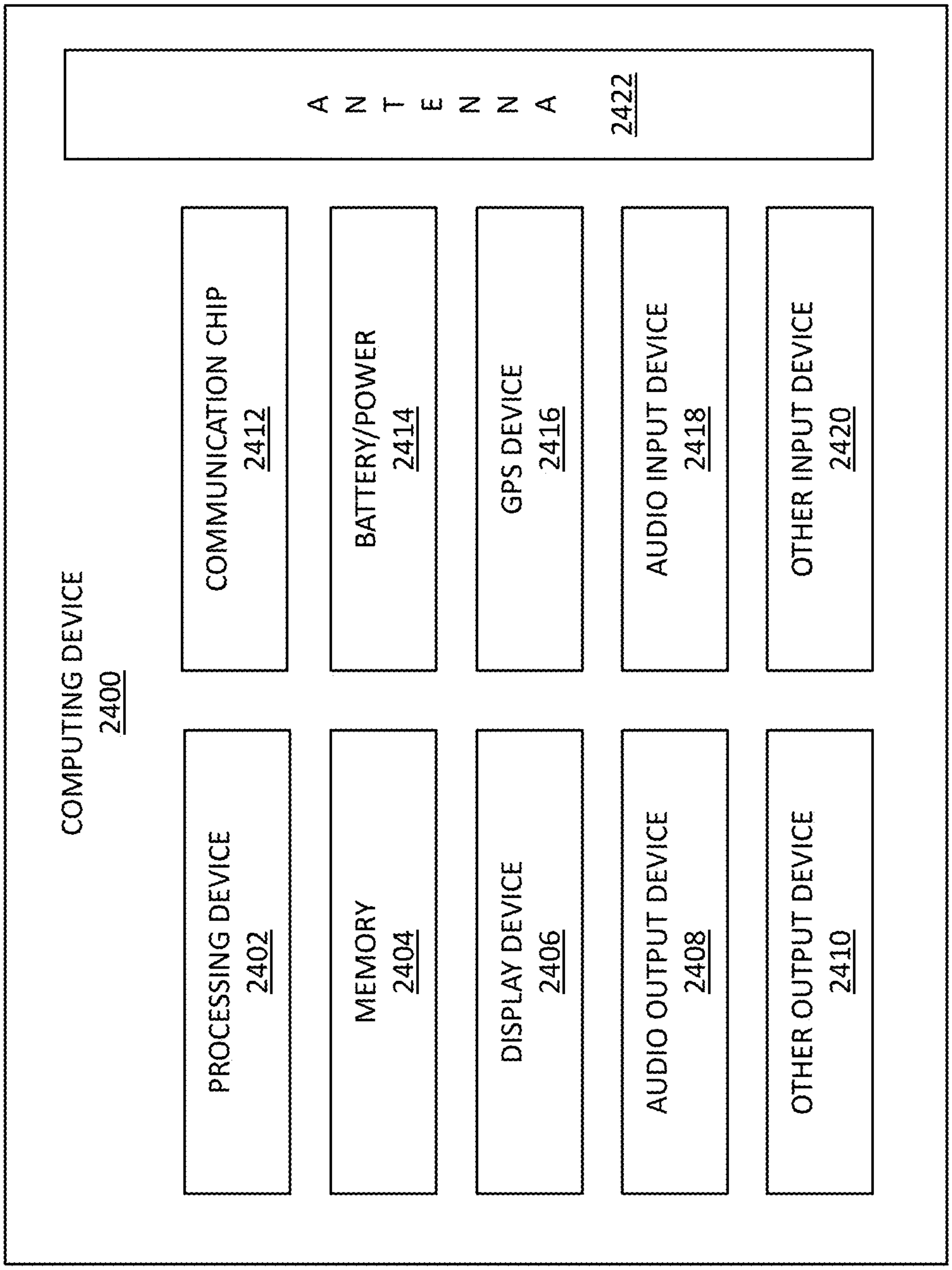
FIG. 9 is a block diagram of an example computing device that may include one or more components with varactor devices with backside electrical contact, according to some embodiments of the disclosure.

FIG. 9 is a block diagram of an example computing device 2400 that may include one or more components with one or more IC devices having one or more varactor devices, according to some embodiments of the disclosure. For example, any suitable ones of the components of the computing device 2400 may include a die (e.g., the die 2002 of FIG. 6B) including one or more varactor devices, according to some embodiments of the disclosure. Any of the components of the computing device 2400 may include a varactor device (e.g., any embodiment of the varactors devices of FIGS. 1 and 2-10) and/or an IC package (e.g., the IC package 2200 of FIG. 7). Any of the components of the computing device 2400 may include an IC device assembly (e.g., the IC device assembly 2300 of FIG. 8).

A number of components are illustrated in FIG. 9 as included in the computing device 2400, but any one or more of these components may be omitted or duplicated, as suitable for the application. In some embodiments, some or all of the components included in the computing device 2400 may be attached to one or more motherboards. In some embodiments, some or all of these components are fabricated onto a single SoC (system-on-chip) die.

Additionally, in various embodiments, the computing device 2400 may not include one or more of the components illustrated in FIG. 9, but the computing device 2400 may include interface circuitry for coupling to the one or more components. For example, the computing device 2400 may not include a display device 2406, but may include display device interface circuitry (e.g., a connector and driver circuitry) to which a display device 2406 may be coupled. In another set of examples, the computing device 2400 may not include an audio input device 2418 or an audio output device 2408, but may include audio input or output device interface circuitry (e.g., connectors and supporting circuitry) to which an audio input device 2418 or audio output device 2408 may be coupled.

The computing device 2400 may include a processing device 2402 (e.g., one or more processing devices). As used herein, the term "processing device" or "processor" may refer to any device or portion of a device that processes electronic data from registers and/or memory to transform that electronic data into other electronic data that may be stored in registers and/or memory. The processing device 2402 may include one or more digital signal processors (DSPs), application-specific ICs (ASICs), central processing units (CPUs), graphics processing units (GPUs), cryptoprocessors (specialized processors that execute cryptographic algorithms within hardware), server processors, or any other suitable processing devices. The computing device 2400 may include a memory 2404, which may itself include one or more memory devices such as volatile memory (e.g., DRAM), nonvolatile memory (e.g., read-only memory (ROM)), flash memory, solid-state memory, and/or a hard drive. In some embodiments, the memory 2404 may include memory that shares a die with the processing device 2402. This memory may be used as cache memory and may include, e.g., eDRAM, and/or spin transfer torque magnetic random-access memory (STT-MRAM).

In some embodiments, the computing device 2400 may include a communication chip 2412 (e.g., one or more communication chips). For example, the communication chip 2412 may be configured for managing wireless communications for the transfer of data to and from the computing device 2400. The term "wireless" and its derivatives may be used to describe circuits, devices, systems, methods, techniques, communications channels, etc., that may communicate data through the use of modulated electromagnetic radiation through a nonsolid medium. The term does not imply that the associated devices do not contain any wires, although in some embodiments they might not.

The communication chip 2412 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultramobile broadband (UMB) project (also referred to as "3GPP2"), etc.). IEEE 802.16 compatible Broadband Wireless Access (BWA) networks are generally referred to as WiMAX networks, an acronym that stands for Worldwide Interoperability for Microwave Access, which is a certification mark for products that pass conformity and interoperability tests for the IEEE 802.16 standards. The communication chip 2412 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication chip 2412 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 2412 may operate in accordance with Code Division Multiple Access (CDMA), Time Division Multiple Access (TDMA), Digital Enhanced Cordless Telecommunications (DECT), Evolution-Data Optimized (EV-DO), and derivatives thereof, as well as any other wireless protocols that are designated as 3G, 4G, 5G, and beyond. The communication chip 2412 may operate in accordance with other wireless protocols in other embodiments. The computing device 2400 may include an antenna 2422 to facilitate wireless communications and/or to receive other wireless communications (such as AM or FM radio transmissions).

In some embodiments, the communication chip 2412 may manage wired communications, such as electrical, optical, or any other suitable communication protocols (e.g., the Ethernet). As noted above, the communication chip 2412 may include multiple communication chips. For instance, a first communication chip 2412 may be dedicated to shorter-range wireless communications such as Wi-Fi or Bluetooth, and a second communication chip 2412 may be dedicated to longer-range wireless communications such as global positioning system (GPS), EDGE, GPRS, CDMA, WiMAX, LTE, EV-DO, or others. In some embodiments, a first communication chip 2412 may be dedicated to wireless communications, and a second communication chip 2412 may be dedicated to wired communications.

In various embodiments, IC devices having one or more varactor devices as described herein may be particularly advantageous for use as part of ESD circuits protecting power amplifiers, low-noise amplifiers, filters (including arrays of filters and filter banks), switches, or other active components. In some embodiments, IC devices having one or more varactor devices as described herein may be used in PMICs, e.g., as a rectifying diode for large currents. In some embodiments, IC devices having one or more varactor devices as described herein may be used in audio devices and/or in various input/output devices.

The computing device 2400 may include battery/power circuitry 2414. The battery/power circuitry 2414 may include one or more energy storage devices (e.g., batteries or capacitors) and/or circuitry for coupling components of the computing device 2400 to an energy source separate from the computing device 2400 (e.g., AC line power).

The computing device 2400 may include a display device 2406 (or corresponding interface circuitry, as discussed above). The display device 2406 may include any visual indicators, such as a heads-up display, a computer monitor, a projector, a touchscreen display, a liquid crystal display (LCD), a light-emitting diode display, or a flat panel display, for example.

The computing device 2400 may include an audio output device 2408 (or corresponding interface circuitry, as discussed above). The audio output device 2408 may include any device that generates an audible indicator, such as speakers, headsets, or earbuds, for example.

The computing device 2400 may include an audio input device 2418 (or corresponding interface circuitry, as discussed above). The audio input device 2418 may include any device that generates a signal representative of a sound, such as microphones, microphone arrays, or digital instruments (e.g., instruments having a musical instrument digital interface (MIDI) output).

The computing device 2400 may include a GPS device 2416 (or corresponding interface circuitry, as discussed above). The GPS device 2416 may be in communication with a satellite-based system and may receive a location of the computing device 2400, as known in the art.

The computing device 2400 may include an other output device 2410 (or corresponding interface circuitry, as discussed above). Examples of the other output device 2410 may include an audio codec, a video codec, a printer, a wired or wireless transmitter for providing information to other devices, or an additional storage device.

The computing device 2400 may include an other input device 2420 (or corresponding interface circuitry, as discussed above). Examples of the other input device 2420 may include an accelerometer, a gyroscope, a compass, an image capture device, a keyboard, a cursor control device such as a mouse, a stylus, a touchpad, a bar code reader, a Quick Response (QR) code reader, any sensor, or a radio frequency identification (RFID) reader.

The computing device 2400 may have any desired form factor, such as a handheld or mobile computing device (e.g., a cell phone, a smart phone, a mobile internet device, a music player, a tablet computer, a laptop computer, a netbook computer, an ultrabook computer, a personal digital assistant (PDA), an ultramobile personal computer, etc.), a desktop computing device, a server or other networked computing component, a printer, a scanner, a monitor, a set-top box, an entertainment control unit, a vehicle control unit, a digital camera, a digital video recorder, or a wearable computing device. In some embodiments, the computing device 2400 may be any other electronic device that processes data.

The following paragraphs provide various examples of the embodiments disclosed herein.

Example 1 provides an IC device, including a first structure including a first metal; a second structure including a second metal, where the second metal is different from the first metal; a third structure wrapping around at least part of the second structure; and a fourth structure over the second structure in a first direction, where the third structure and the fourth structure include an electrically conductive material, a height of the second structure in the first direction is greater than a height of the first structure in the first direction, and a width of the second structure in a second direction orthogonal to the first direction is greater than a height of the first structure in the second direction.

Example 2 provides the IC device according to example 1, where the width of the first structure is not greater than 12 nanometers, or the width of the second structure is in a range from 20 to 50 nanometers.

Example 3 provides the IC device according to example 1 or 2, where a height of the fourth structure in the first direction is at least 3 nanometers.

Example 4 provides the IC device according to any of the preceding examples, where the second structure includes a first cross-section and a second cross-section, the fourth structure is closer to the first cross-section than the second cross-section, and a width of the first cross-section along the second direction is greater than a width of a width of the second cross-section.

Example 5 provides the IC device according to any of the preceding examples, where the second structure includes a first cross-section and a second cross-section, the fourth structure is closer to the first cross-section than the second cross-section, and a width of the first cross-section along the second direction is greater than a width of a width of the second cross-section.

Example 6 provides the IC device according to any of the preceding examples, further including a fifth structure including a third metal; a first via between the first structure and the fifth structure; and a second via between the second structure and the fifth structure, where a height of the first via in the first direction is greater than a height of the second via in the first direction.

Example 7 provides the IC device according to example 6, where the third metal is the same as the second metal.

Example 8 provides the IC device according to any of the preceding examples, where the first structure is coupled to a source region or a drain region of a transistor, and the second structure is coupled to a channel region of the transistor.

Example 9 provides the IC device according to any of the preceding examples, where the first metal is ruthenium, or the second metal is copper.

Example 10 provides the IC device according to any of the preceding examples, where the electrically conductive material includes cobalt.

Example 11 provides an IC device, including a transistor including a source region, a drain region, and a channel region; a first layer including a first structure and a second structure, where the first structure is coupled to the source region or the drain region, the second structure is coupled to the channel region, a width of the first structure in a first direction is smaller than a width of the second structure in the first direction; and a second layer including a third metal, where a distance between the first structure and the second layer in a second direction orthogonal to the first direction is longer than a distance between the second structure and the second layer in the second direction.

Example 12 provides the IC device according to example 11, where the first layer is between the transistor and the second layer in the second direction.

Example 13 provides the IC device according to example 11 or 12, where the first structure is at least part of a wordline of a memory device, and the second structure is at least part of a bitline of the memory device.

Example 14 provides the IC device according to any one of examples 11-13, further including a first via between the first structure and the second layer; and a second via between the second structure and the second layer, where a length of the first layer in the second direction is greater than a length of the second layer in the second direction.

Example 15 provides the IC device according to any one of examples 11-14, where the first structure, the second structure, and the second layer are separated by one or more electrical insulators.

Example 16 provides a method for forming an IC device, including forming a first structure in a first opening in a structure, where the first structure includes a first metal, and the structure includes an electrical insulator; forming a layer, where at least part of the layer is in a second opening and over one or more surfaces of the second opening, the layer includes a first electrically conductive material, the layer forms a new opening, and a width of the first opening is smaller than a width of the second opening; forming a second structure in the new opening, where the second structure includes a second metal and is at least partially wrapped by the layer; and forming a third structure over the second structure, where the third structure includes a second electrically conductive material.

Example 17 provides the method according to example 16, further including before forming the third structure over the second structure, removing a portion of the layer or a portion of the second structure.

Example 18 provides the method according to example 16 or 17, further including after forming the third structure over the second structure, providing an electrical insulator over the third structure; forming openings in the electrical insulator, where the openings have different dimensions; and forming vias in the openings, where the vias include a first via connected to the first structure and a second via connected to the third structure.

Example 19 provides the method according to example 18, where forming openings in the electrical insulator includes forming the openings through a selective etching process, where a rate of etching the electrical insulator is higher than a rate of etching the second electrically conductive material in the selective etching process.

Example 20 provides the method according to any one of examples 16-19, where the width of the first opening is not greater than 12 nanometers, and the width of the second opening is in a range from 20 to 50 nanometers.

Example 21 provides an IC package, including the IC device according to any one of examples 1-15; and a further IC component, coupled to the device.

Example 22 provides the IC package according to example 21, where the further IC component includes one of a package substrate, an interposer, or a further IC die.

Example 23 provides the IC package according to example 21 or 22, where the IC device according to any one of examples 1-15 may include, or be a part of, at least one of a memory device, a computing device, a wearable device, a handheld electronic device, and a wireless communications device.

Example 24 provides an electronic device, including a carrier substrate; and one or more of the IC device according to any one of examples 1-15 and the IC package according to any one of examples 21-23, coupled to the carrier substrate.

Example 25 provides the electronic device according to example 24, where the carrier substrate is a motherboard.

Example 26 provides the electronic device according to example 24, where the carrier substrate is a PCB.

Example 27 provides the electronic device according to any one of examples 24-26, where the electronic device is a wearable electronic device or handheld electronic device.

Example 28 provides the electronic device according to any one of examples 24-27, where the electronic device further includes one or more communication chips and an antenna.

Example 29 provides the electronic device according to any one of examples 24-28, where the electronic device is an RF transceiver.

Example 30 provides the electronic device according to any one of examples 24-28, where the electronic device is one of a switch, a power amplifier, a low-noise amplifier, a filter, a filter bank, a duplexer, an upconverter, or a downconverter of an RF communications device, e.g., of an RF transceiver.

Example 31 provides the electronic device according to any one of examples 24-30, where the electronic device is a computing device.

Example 32 provides the electronic device according to any one of examples 24-31, where the electronic device is included in a base station of a wireless communication system.

Example 33 provides the electronic device according to any one of examples 24-31, where the electronic device is included in a user equipment device of a wireless communication system.

Example 34 provides the method according to any one of examples 16-20, further including processes for forming the IC device according to any one of examples 1-15.

Example 35 provides the method according to any one of examples 16-20, further including processes for forming the IC package according to any one of the examples 21-23.

Example 36 provides the method according to any one of examples 15-20, further including processes for forming the electronic device according to any one of the examples 24-33.

The above description of illustrated implementations of the disclosure, including what is described in the Abstract, is not intended to be exhaustive or to limit the disclosure to the precise forms disclosed. While specific implementations of, and examples for, the disclosure are described herein for illustrative purposes, various equivalent modifications are possible within the scope of the disclosure, as those skilled in the relevant art will recognize. These modifications may be made to the disclosure in light of the above detailed description.

The invention claimed is:

1. An integrated circuit (IC) device, comprising:
a first structure comprising a first metal;
a second structure comprising a second metal, wherein the second metal is different from the first metal;
a third structure wrapping around at least part of the second structure; and
a fourth structure over the second structure in a first direction,
wherein:
the first structure is coupled to a source region or a drain region of a transistor,
the second structure is coupled to a channel region of the transistor,
the third structure and the fourth structure comprise an electrically conductive material,
a height of the second structure in the first direction is greater than a height of the first structure in the first direction, and
a width of the second structure in a second direction orthogonal to the first direction is greater than a height of the first structure in the second direction.

2. The IC device according to claim 1, wherein a width of the first structure is not greater than about 12 nanometers, or the width of the second structure is between about 20 and 50 nanometers.

3. The IC device according to claim 1, wherein a height of the fourth structure in the first direction is at least 3 nanometers.

4. The IC device according to claim 1, wherein:
the second structure comprises a first cross-section and a second cross-section,
the fourth structure is closer to the first cross-section than the second cross-section, and
a width of the first cross-section along the second direction is greater than a width of a width of the second cross-section.

5. The IC device according to claim 1, further comprising:
a fifth structure comprising a third metal;
a first via between the first structure and the fifth structure; and
a second via between the second structure and the fifth structure,
wherein a height of the first via in the first direction is greater than a height of the second via in the first direction.

6. The IC device according to claim 5, wherein the third metal is the same as the second metal.

7. The IC device according to claim 1, wherein the first metal is ruthenium, or the second metal is copper.

8. The IC device according to claim 1, wherein the electrically conductive material comprises cobalt.

9. An integrated circuit (IC) device, comprising:
a first structure comprising a first metal;
a second structure comprising a second metal, wherein the second metal is different from the first metal, the second structure having a first cross-section and a second cross-section;
a third structure wrapping around at least part of the second structure; and
a fourth structure over the second structure in a first direction,
wherein:
the fourth structure is closer to the first cross-section than the second cross-section,
a width of the first cross-section along the second direction is greater than a width of a width of the second cross-section,
the third structure and the fourth structure comprise an electrically conductive material,
a height of the second structure in the first direction is greater than a height of the first structure in the first direction, and
a width of the second structure in a second direction orthogonal to the first direction is greater than a height of the first structure in the second direction.

10. The IC device according to claim 9, wherein a width of the first structure is not greater than about 12 nanometers, or the width of the second structure is between about 20 and 50 nanometers.

11. The IC device according to claim 9, wherein a height of the fourth structure in the first direction is at least 3 nanometers.

12. The IC device according to claim 9, further comprising:
a fifth structure comprising a third metal;
a first via between the first structure and the fifth structure; and
a second via between the second structure and the fifth structure,
wherein a height of the first via in the first direction is greater than a height of the second via in the first direction.

13. The IC device according to claim 9, wherein the first structure is coupled to a source region or a drain region of a transistor, and the second structure is coupled to a channel region of the transistor.

14. The IC device according to claim 9, wherein the first metal is ruthenium, or the second metal is copper.

15. The IC device according to claim 9, wherein the electrically conductive material comprises cobalt.

16. An integrated circuit (IC) device, comprising:
a first structure comprising a first metal;
a second structure comprising a second metal, wherein the second metal is different from the first metal;
a third structure wrapping around at least part of the second structure; and
a fourth structure over the second structure in a first direction;
a fifth structure comprising a third metal;
a first via between the first structure and the fifth structure; and
a second via between the second structure and the fifth structure,
wherein:
a height of the first via in the first direction is greater than a height of the second via in the first direction,
the third structure and the fourth structure comprise an electrically conductive material, a height of the second structure in the first direction is greater than a height of the first structure in the first direction, and a width of the second structure in a second direction orthogonal to the first direction is greater than a height of the first structure in the second direction.

17. The IC device according to claim 16, wherein a width of the first structure is not greater than about 12 nanometers, or the width of the second structure is between about 20 and 50 nanometers.

18. The IC device according to claim 16, wherein a height of the fourth structure in the first direction is at least 3 nanometers.

19. The IC device according to claim 16, wherein:

the second structure comprises a first cross-section and a second cross-section, the fourth structure is closer to the first cross-section than the second cross-section, and a width of the first cross-section along the second direction is greater than a width of a width of the second cross-section.

20. The IC device according to claim 16, wherein the third metal is the same as the second metal.

* * * * *